United States Patent
Bannae et al.

(10) Patent No.: US 10,120,052 B2
(45) Date of Patent: Nov. 6, 2018

(54) MEDICAL IMAGE PROCESSING APPARATUS AND MEDICAL IMAGE PROCESSING METHOD

(71) Applicant: Toshiba Medical Systems Corporation, Otawara-Shi (JP)

(72) Inventors: Shuhei Bannae, Otawara (JP); Shigeharu Ohyu, Yaita (JP); Masashi Yoshida, Otawara (JP); Yoshihiro Ikeda, Sakura (JP); Fumiki Nakano, Utsunomiya (JP); Mitsukazu Kamata, Nasushiobara (JP); Tetsuya Yokota, Nasushiobara (JP); Tatsuya Kimoto, Utsunomiya (JP); Masao Yui, Otawara (JP); Tomohisa Fukunaga, Nasushiobara (JP); Shigehide Kuhara, Otawara (JP); Kota Aoyagi, Nasushiobara (JP)

(73) Assignee: Toshiba Medical Systems Corporation, Otawara-Shi (JP)

( * ) Notice: Subject to any disclaimer, the term of this patent is extended or adjusted under 35 U.S.C. 154(b) by 0 days.

(21) Appl. No.: 15/011,905

(22) Filed: Feb. 1, 2016

(65) Prior Publication Data
US 2016/0232660 A1     Aug. 11, 2016

(30) Foreign Application Priority Data
Feb. 5, 2015  (JP) .................. 2015-020929

(51) Int. Cl.
*G01R 33/56* (2006.01)
*G01R 33/563* (2006.01)
(Continued)

(52) U.S. Cl.
CPC ... *G01R 33/5608* (2013.01); *G01R 33/56316* (2013.01); *G06T 7/11* (2017.01);
(Continued)

(58) Field of Classification Search
None
See application file for complete search history.

(56) References Cited

U.S. PATENT DOCUMENTS 5,105,816 A * 4/1992 Shimura ............... A61B 8/06
                                                          600/454
6,310,270 B1 * 10/2001 Huang ............... A01K 67/0276
                                                          435/325
(Continued)

FOREIGN PATENT DOCUMENTS

JP    2007-135894    6/2007
JP    2009-34385     2/2009

OTHER PUBLICATIONS

Lehmpfuhl, Monika C., et al. "Examination of blood flow in rat brain vessels using fluid dynamic simulation and phase contrast magnetic resonance angiography." Industrial Electronics and Applications (ICIEA), 2010 the 5th IEEE Conference on. IEEE, 2010.*
(Continued)

*Primary Examiner* — Michelle M Entezari
(74) *Attorney, Agent, or Firm* — Oblon, McClelland, Maier & Neustadt, L.L.P.

(57) ABSTRACT

In one embodiment, a medical image processing apparatus includes a display and processing circuitry. The processing circuitry is configured to (a) calculate fluid information including flow-velocity vectors based on three-dimensional image data of plural time phases, which are acquired by a phase contrast method of magnetic resonance imaging, and in which fluid flowing inside a lumen is depicted, (b) identify a branching position where a second lumen branches from a first lumen, based on change in flow volume of fluid flowing inside the first lumen along an extending direction of the first lumen, and (c) cause the display to display an analysis result including fluid information of fluid
(Continued)

| | THE FIRST TRACE METHOD | THE SECOND TRACE METHOD | THE THIRD TRACE METHOD | ... |
|---|---|---|---|---|
| TRACE METHOD | LINEARLY TRACING A TRACK OF A BLOOD FLOW IN SUCH A MANNER THAT FLOW-VELOCITY VECTORS BECOME PERPENDICULAR TO THE UPSTREAM OF THE TARGET CROSS-SECTION | FLOW VOLUME OF THE TARGET CROSS-SECTION DOES NOT CHANGE FROM FLOW VOLUME OF THE CROSS-SECTION ON UPSTREAM SIDE | A DIRECTION OF THE FLOW-VELOCITY VECTOR OF THE TARGET CROSS-SECTION BECOMES EQUAL TO A DIRECTION OF THE FLOW-VELOCITY VECTOR OF THE ADJACENT CROSS-SECTION ON THE UPSTREAM SIDE | ... |
| SCHEMATIC DIAGRAM | UPSTREAM CROSS-SECTION / FLOW-VELOCITY VECTOR | FLOW VOLUME  50 40 →90  10 40 40 →90 | FLOW-VELOCITY VECTOR / VERTICAL COMPONENT | ... | flowing inside the second lumen, based on the branching position.

12 Claims, 14 Drawing Sheets

(51) Int. Cl.
  *G06T 7/11* (2017.01)
  *G06T 7/215* (2017.01)
(52) U.S. Cl.
  CPC .... *G06T 7/215* (2017.01); *G06T 2207/10016* (2013.01); *G06T 2207/10088* (2013.01); *G06T 2207/30104* (2013.01)

(56) References Cited

U.S. PATENT DOCUMENTS

| | | | | |
|---|---|---|---|---|
| 7,177,453 | B2* | 2/2007 | Suryanarayanan | G06T 7/0012 382/128 |
| 7,953,262 | B2* | 5/2011 | Suryanarayanan | G06K 9/4638 382/128 |
| 9,595,099 | B2* | 3/2017 | Salafia | G06T 7/11 |
| 9,679,374 | B2* | 6/2017 | Choi | A61B 5/02007 |
| 2006/0019326 | A1* | 1/2006 | Vacanti | C12Q 1/00 435/18 |
| 2006/0116582 | A1* | 6/2006 | Yoshida | A61B 8/06 600/458 |
| 2007/0166774 | A1* | 7/2007 | Groman | C07K 16/44 435/7.92 |
| 2010/0094122 | A1* | 4/2010 | Kiraly | A61B 5/021 600/419 |
| 2010/0175468 | A1* | 7/2010 | Anzai | G01F 1/6842 73/202 |
| 2011/0315147 | A1* | 12/2011 | Wood | A61M 16/0486 128/207.15 |
| 2012/0269387 | A1* | 10/2012 | Becker | G06T 7/254 382/103 |
| 2012/0277559 | A1* | 11/2012 | Kohl-Bareis | A61B 5/0261 600/324 |
| 2015/0094582 | A1* | 4/2015 | Tanaka | A61B 8/06 600/441 |
| 2015/0199121 | A1* | 7/2015 | Gulaka | G06F 3/04845 715/771 |
| 2016/0338613 | A1* | 11/2016 | Beckers | G06T 7/174 |

OTHER PUBLICATIONS

Grubb, Robert L., et al. "The effects of changes in PaCO2 cerebral blood volume, blood flow, and vascular mean transit time." Stroke 5.5 (1974): 630-639.*
Volumetric flow rate from wikipedia post as of Nov. 8, 2017.*

* cited by examiner

| TRACE METHOD | THE FIRST TRACE METHOD | THE SECOND TRACE METHOD | THE THIRD TRACE METHOD |
|---|---|---|---|
| ⋮ | LINEARLY TRACING A TRACK OF A BLOOD FLOW IN SUCH A MANNER THAT FLOW-VELOCITY VECTORS BECOME PERPENDICULAR TO THE UPSTREAM OF THE TARGET CROSS-SECTION | FLOW VOLUME OF THE TARGET CROSS-SECTION DOES NOT CHANGE FROM FLOW VOLUME OF THE CROSS-SECTION ON UPSTREAM SIDE | A DIRECTION OF THE FLOW-VELOCITY VECTOR OF THE TARGET CROSS-SECTION BECOMES EQUAL TO A DIRECTION OF THE FLOW-VELOCITY VECTOR OF THE ADJACENT CROSS-SECTION ON THE UPSTREAM SIDE |
| SCHEMATIC DIAGRAM | 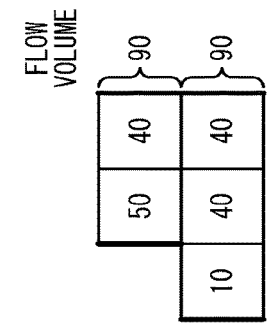 | 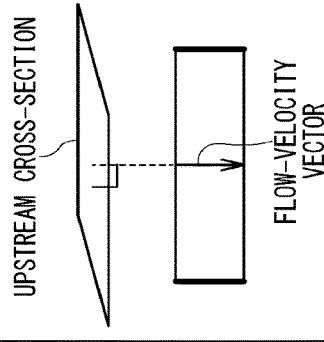 | 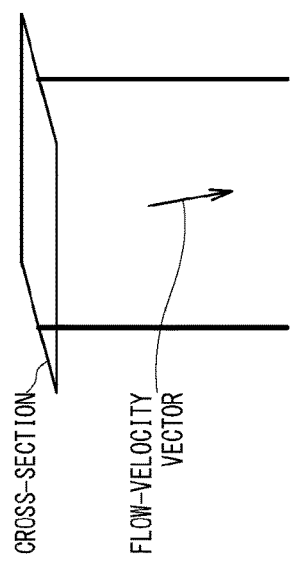 |

MEDICAL IMAGE PROCESSING APPARATUS AND MEDICAL IMAGE PROCESSING METHOD

CROSS-REFERENCE TO RELATED APPLICATION

This application is based upon and claims the benefit of priority from Japanese Patent Application No. 2015-20929, filed on Feb. 5, 2015, the entire contents of which are incorporated herein by reference.

FIELD

Embodiments described herein relate generally to a medical image processing apparatus and a medical image processing method.

BACKGROUND

A magnetic resonance imaging apparatus is an imaging apparatus configured to magnetically excite nuclear spin of a patient placed in a static magnetic field with an RF pulse having the Larmor frequency and to reconstruct an image based on magnetic resonance signals emitted from the patient due to the excitation.

A magnetic resonance imaging apparatus is different from an image diagnostic apparatus using radial rays such as X-rays in that a patient is not exposed to radiation. Thus, magnetic resonance imaging apparatuses have been increasingly widely used in clinical practice as an apparatus capable of diagnostic imaging in a less-invasive manner.

Further, since blood vessels can be distinguishably imaged by magnetic resonance imaging without using contrast agent, various imaging techniques of non-contrast MRA (Magnetic Resonance Angiography) have been studied. Specifically, various non-contrast imaging techniques to which the above basic imaging methods such as a TOF (Time Of Flight) method and a phase contrast method are applied have been developed. As one of such non-contrast MRA technique, a method of depicting blood vessels based on four-dimensional vector information obtained by ECG (electrocardiogram) synchronization scan of a magnetic resonance imaging has been developed. The above-described four-dimensional vector information includes three-dimensional image data and its time phase.

A bloodstream image obtained by the above-described non-contrast imaging is an image in which blood flow velocity and blood flow volume are visually depicted (in the present specification, hereinafter, a bloodstream image means a non-contrast bloodstream image unless otherwise specifically noted). In order to appropriately diagnose and remedy blood vessel disease such as arteriosclerosis, ischemic heart disease, and cerebral ischemia, it is important to obtain more accurate bloodstream information by analyzing a bloodstream image.

When data acquired by the above-described non-contrast magnetic resonance imaging are analyzed by a conventional medical image processing apparatus, sufficient information can be obtained for a blood vessel with a comparatively large vascular diameter such as an aorta and a pulmonary artery (hereinafter, such a blood vessel is referred to as a major blood vessel). However, it is difficult to obtain sufficient information for a blood vessels which has a comparatively small vascular diameter and is branched from a large blood vessel (hereinafter, such a blood vessel with a small vascular diameter is referred to as a branched blood vessel).

In non-contrast MRA using a phase contrast method as an example, a track of a blood flow is depicted by tracing flow-velocity vectors calculated for respective voxels. When a vascular diameter of a branched blood vessel is smaller than the voxel size, a flow-velocity vector of this branched blood vessel is not calculated at the position where this branched blood vessel branches from its major blood vessel. In general, one flow-velocity vector is calculated for one voxel and it is impossible to depict tracks of blood flows in both of a major blood vessel and its branched blood vessel. When spatial resolution is increased in order to depict such a branched blood vessel, this causes another problem that imaging time increases.

Moreover, when sufficient information on a branched blood vessel is not obtained in image diagnosis, a lesion region causing a symptom such as ischemia which appears on a patient cannot be identified in some cases.

As mentioned above, a branched blood vessel is connected to another blood vessel such as a major blood vessel. Accordingly, if sufficient information on a branched blood vessel is obtained, it becomes possible to predict and/or diagnose occurrence of blood vessel disease such as ischemic heart disease and cerebral ischemia. Additionally, if sufficient information on a branched blood vessel is obtained, it becomes possible to occlude the branched blood vessel by treatment using a medical instrument such as a stent so that supply of nutrition to an important organ is not interrupted.

Furthermore, a new blood vessel which has appeared due to neoangiogenesis caused by a malignant tumor is a factor of rapidly advancing malignant grade of the tumor. If such a new blood vessel can be observed, it leads to early detection of a tumor.

BRIEF DESCRIPTION OF THE DRAWINGS

In the accompanying drawings:

FIG. 13A and FIG. 13B illustrate a method a method of generating the second bloodstream image in the second embodiment.

DETAILED DESCRIPTION

Hereinafter, medical image processing apparatuses and medical image processing methods of embodiments of the present disclosure will be described by reference to the accompanying drawings.

In one embodiment, a medical image processing apparatus includes a display and processing circuitry. The processing circuitry is configured to (a) calculate fluid information including flow-velocity vectors based on three-dimensional image data of plural time phases, which are acquired by a phase contrast method of magnetic resonance imaging, and in which fluid flowing inside a lumen is depicted, (b) identify a branching position where a second lumen branches from a first lumen, based on change in flow volume of fluid flowing inside the first lumen along an extending direction of the first lumen, and (c) cause the display to display an analysis result including fluid information of fluid flowing inside the second lumen, based on the branching position.

(Overall Configuration)

Figure 1:
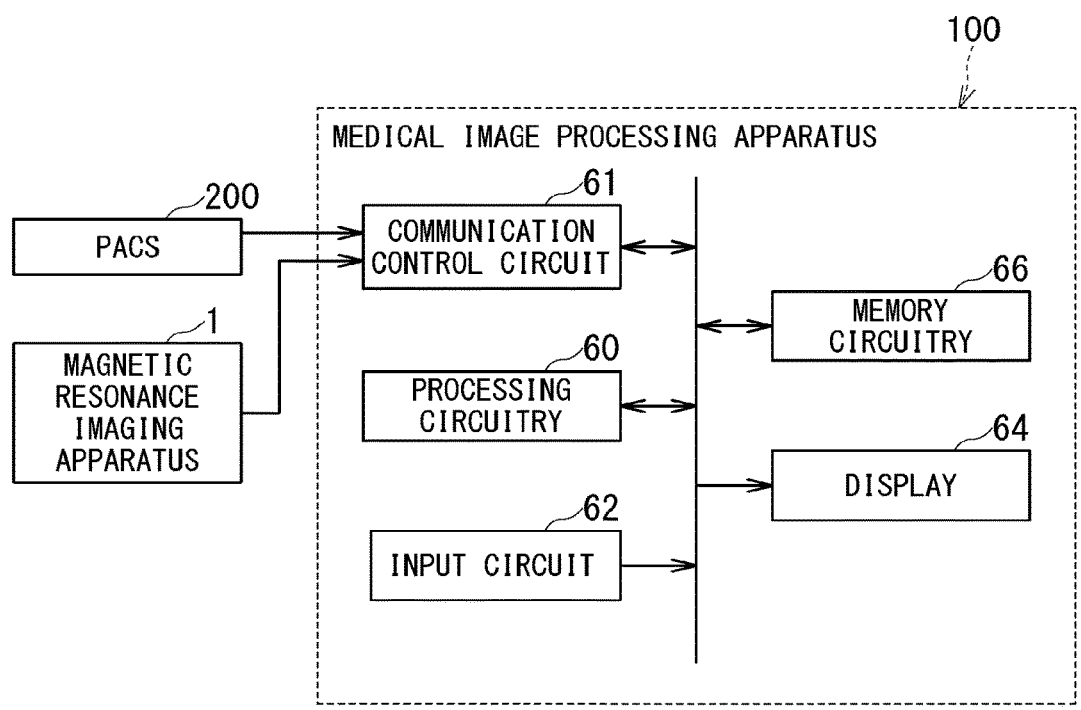
FIG. 1 is a general block diagram illustrating an example of configuration of a medical image processing apparatus of one embodiment.

FIG. 1 is a general block diagram illustrating an example of configuration of a medical image processing apparatus 100 of one embodiment. As shown in FIG. 1, the medical image processing apparatus 100 includes a communication control circuit 61, processing circuitry 60, an input circuit 62, a display 64, and memory circuitry 66.

The communication control circuit 61 connects the medical image processing apparatus 100 with a medical PACS (Picture Archiving and Communication System) 200 and a magnetic resonance imaging apparatus 1 via an electronic network. The communication control circuit 61 implements various communication protocols according to a network aspect.

The above-described electronic network means a general information communication network using telecommunications technology and includes, for example, a telephone communication network, an optical fiber communication network, a cable communication network, and a satellite communication network in addition to a hospital LAN (Local Area Network), a wireless/wired LAN, and the Internet network. The medical image processing apparatus 100 acquires data from the PACS 200 or the magnetic resonance imaging apparatus 1 via the electronic network. The medical image processing apparatus 100 of the present embodiment includes, for example, a diagnostic reading device and a medical image display device.

Incidentally, the PACS 200 and the medical image processing apparatus 100 may be configured as a system of cloud computing.

Data inputted from the magnetic resonance imaging apparatus 1 or the PACS 200 to the medical image processing apparatus 100 are image data which are acquired by a method referred to as Four-Dimensional Flow MRI and include four-dimensional velocity vector information composed of a velocity vector in a three-dimensional image and the time phase of this three-dimensional image. Bloodstream data acquired by Four-Dimensional Flow MRI are data of fluid information on blood flowing through a blood vessel. This Four-Dimensional Flow MRI is an imaging method of acquiring velocity information of blood in respective axes (i.e., the X-axis, Y-axis, and Z axis) for each time phase under ECG gated cine-imaging (i.e., ECG synchronization scan) and the phase contrast method.

The phase contrast method is an imaging technique capable of acquiring velocity information of blood by using application of bipolar gradient magnetic fields. Specifically, a phase of nuclear spin of a moving tissue changes by the amount in proportion to the velocity component in the direction of the gradient magnetic field. The above-described application of bipolar gradient magnetic fields means, for example, to apply two gradient magnetic fields whose polarities are respectively positive and negative with the same intensity at the same time phase.

Consider a case where bipolar gradient magnetic fields are separately applied to a stationary tissue with the same intensity in such a short period that both can be regarded as a pair of gradient magnetic fields. In this case, the phase of nuclear spin of this stationary tissue advances by the anterior gradient magnetic field having a positive polarity as an example, and then advances in the opposite direction by the same amount as that caused by the anterior gradient magnetic field so as to return to the original state when the posterior gradient magnetic field having a negative polarity as an example is applied. The above-described original state means the state before application of the anterior gradient magnetic field.

On the other hand, in a moving tissue such as blood, a phase shift is caused depending on its velocity. The faster flow velocity of a moving tissue is, the larger its phase shift becomes. Since a phase shift occurs in flowing blood due to application of bipolar gradient magnetic fields, flow velocity of blood can be calculated based on phase shift amount. In Four-Dimensional Flow MRI, bloodstream data including four-dimensional velocity information composed of a three-dimensional velocity vector in three-dimensional image data and its time phase can be acquired by applying a pair of bipolar gradient magnetic fields to each of the X-axis, Y-axis, and Z-axis and obtaining flow velocity in each of these three axial directions for each time phase. As to data acquired by Four-Dimensional Flow MRI, they will be described below.

The processing circuitry 60 equipped with a processor executes programs stored in the memory circuitry 66 so as to calculate flow-velocity vectors and generate a bloodstream image.

The memory circuitry 66 is configured of memory media readable by the processing circuitry 60 such as a RAM (Random Access Memory), a ROM (Read Only Memory), a magnetic memory media, an optical memory media, and a semiconductor memory. In addition, the memory circuitry 66 and the processing circuitry 60 may be configured so that some or all of the programs and data stored in these memory media can be downloaded via an electronic network.

The display 64 is configured of, for example, a general display device such as a liquid crystal display and an OLED (Organic Light Emitting Diode), and displays images under the control of the processing circuitry 60.

The input circuit 62 is configured of, for example, a general input devices such as a keyboard, a touch panel, a numerical keypad, and a mouse. The input circuit 62 outputs input signals corresponding to image processing and user's operations such as selection of a start cross-section to the processing circuitry 60.

Hereinafter, the first and second embodiments will be described in order. The first embodiment relates to a method of displaying a track of blood flow of a branched blood vessel by (a) identifying the cross-section at which the branched blood vessel exists based on flow-velocity vectors and then (b) generating a bloodstream image by changing a threshold value for flow-velocity vectors. The second embodiment relates to a method of (a) determining whether plural trace methods can be applied or not based on flow-velocity vectors and (b) tracing a blood flow according to this determination result.

First Embodiment

The first embodiment relates to a method of displaying a track of a blood flow of a branched blood vessel as a result of analysis by (a) identifying the cross-section at which the branched blood vessel branches from its major blood vessel based on flow-velocity vectors and then (b) generating a bloodstream image by changing a threshold value for flow-velocity vectors.

(1) Configuration

Figure 2:
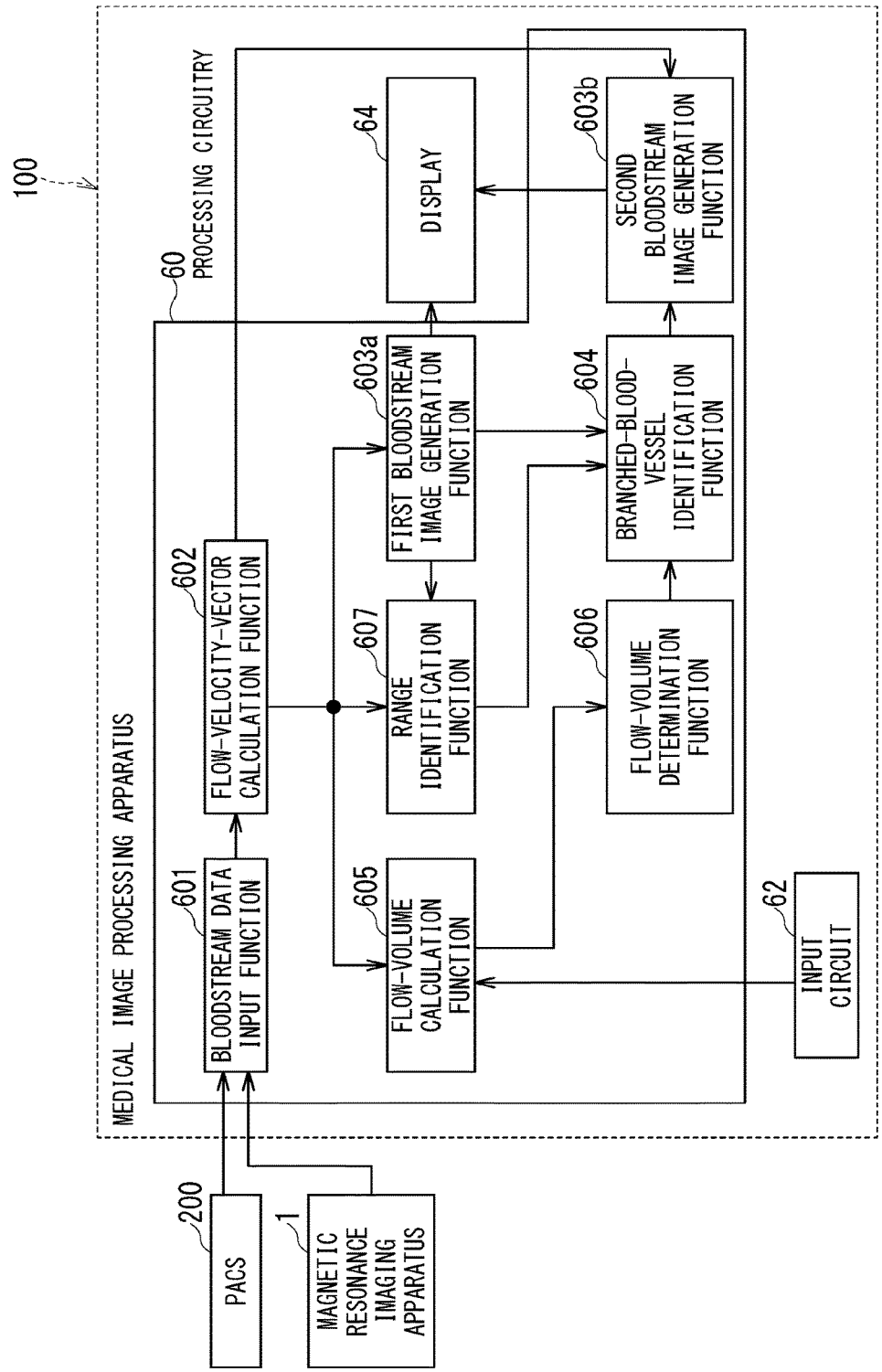
FIG. 2 is a functional block diagram illustrating an example of configuration of the medical image processing apparatus of the first embodiment.

FIG. 2 is a functional block diagram illustrating an example of configuration of the medical image processing apparatus 100 of the first embodiment. As shown in FIG. 2, the medical image processing apparatus 100 has a bloodstream data input function 601, a flow-velocity-vector calculation function 602, a first bloodstream image generation function 603a, a second bloodstream image generation function 603b, a branched-blood-vessel identification function 604, a flow-volume calculation function 605, a flow-volume determination function 606, and a range identification function 607. The processing circuitry 60 implements the above-described functions by executing programs stored in the memory circuitry 66.

The bloodstream data input function 601 causes the PACS 200 and/or the magnetic resonance imaging apparatus 1 to output bloodstream data to the medical image processing apparatus 100. The bloodstream data are data including four-dimensional velocity information composed of flow-velocity vectors of respective voxels in a three-dimension image and the time phase of this three-dimension image. As mentioned above, the bloodstream data are data which are acquired by Four-Dimensional Flow MRI and include velocity vector information of the X-axis, Y-axis, and Z-axis for each time phase. As to the bloodstream data, they will be described below.

The flow-velocity-vector calculation function 602 calculates flow-velocity vectors of respective voxels for each time phase based on the bloodstream data. These flow-velocity vectors indicate a track of blood flow.

On the basis of the magnitude of each of the flow-velocity vectors, the first bloodstream image generation function 603a generates the first bloodstream image in which a track of a blood flow of a major blood vessel is visualized.

The branched-blood-vessel identification function 604 identifies a position of a branched blood vessel branching form a major blood vessel, based on flow-velocity vectors. As to a method of identifying a position of a branched blood vessel, it will be described below.

The flow-volume calculation function 605 defines one of plural cross-sections of a three-dimensional bloodstream image as a start cross-section. Then, the flow-volume calculation function 605 determines plural cross-sections which are orthogonal to the direction of the flow-velocity vector and are in the downstream of the start cross-section. Further, the flow-volume calculation function 605 calculates an in-plane integral value indicative of flow volume for each cross-section. In other words, the flow-volume calculation function 605 calculates flow volume for each cross-section by integrating magnitude of all the flow-velocity vectors calculated for every voxel included in each cross-section. As to a method of determining each cross-section and a method of calculating flow volume, they will be described below.

The flow-volume determination function 606 compares flow volume of a target cross-section with the flow volume of the cross-section adjacent to this target cross-section on the upstream side of a blood flow, and repeats this comparison for each cross-section for which flow volume is calculated.

The second bloodstream image generation function 603b generates the second bloodstream image in which the position of the identified branched blood vessel is visualized.

The range identification function 607 identifies a branched-blood-vessel region adjacent to the outside of a major-blood-vessel region, based on the first bloodstream image. As to the major-blood-vessel region and the branched-blood-vessel region, they will be described below.

(2) Operation

Figure 3:
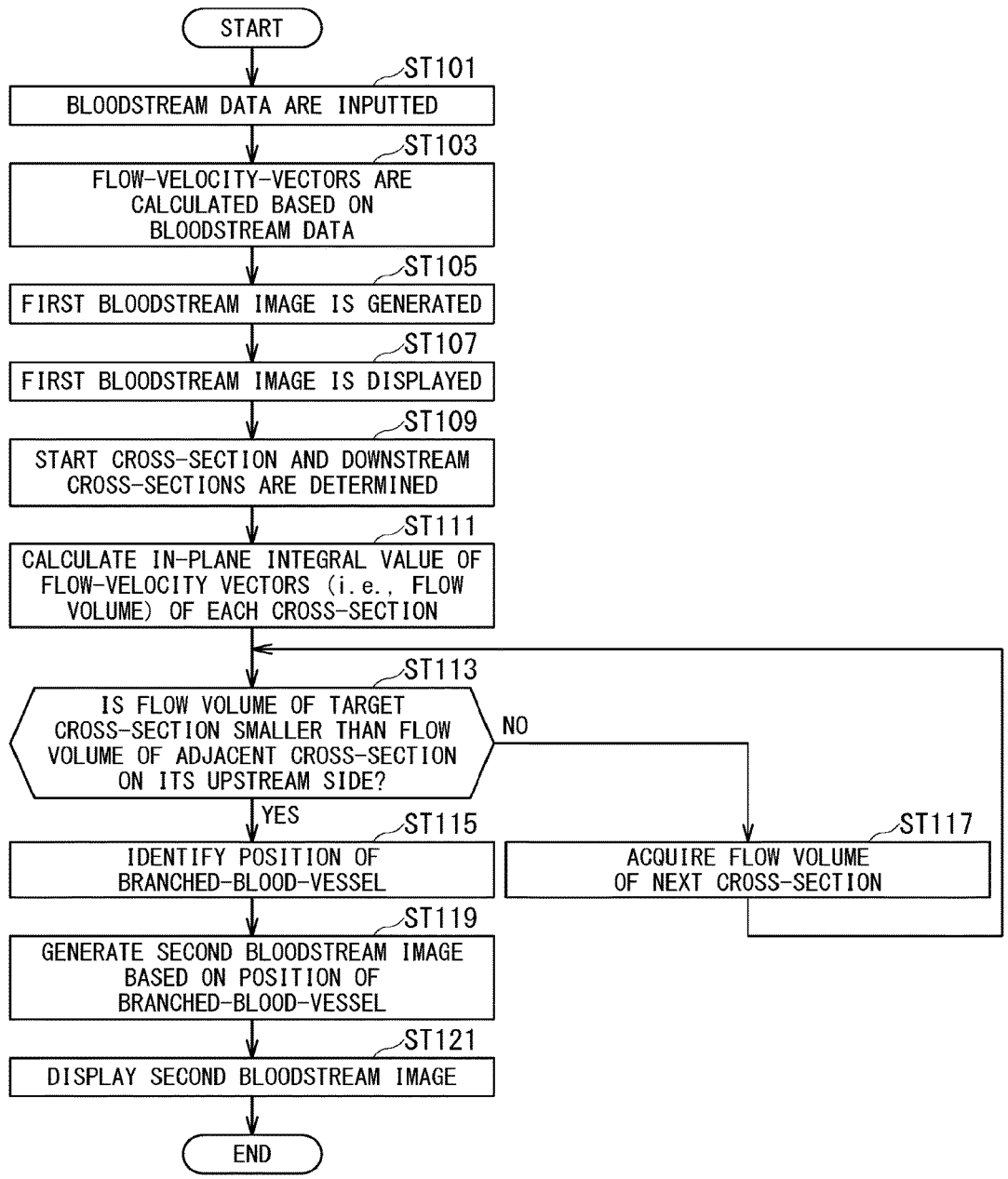
FIG. 3 is a flowchart illustrating an example of an operation performed by the magnetic resonance imaging apparatus of the first embodiment.

FIG. 3 is a flowchart illustrating an example of an operation performed by the magnetic resonance imaging apparatus 1 of the first embodiment. In FIG. 3, each step number is indicated as ST and odd number on the right side of ST.

In the step ST101, bloodstream data are inputted to the medical image processing apparatus 100 by the bloodstream data input function 601.

In the step ST103, the flow-velocity-vector calculation function 602 calculates flow-velocity vectors of respective voxels based on the bloodstream data inputted in the step ST101.

Figure 4:
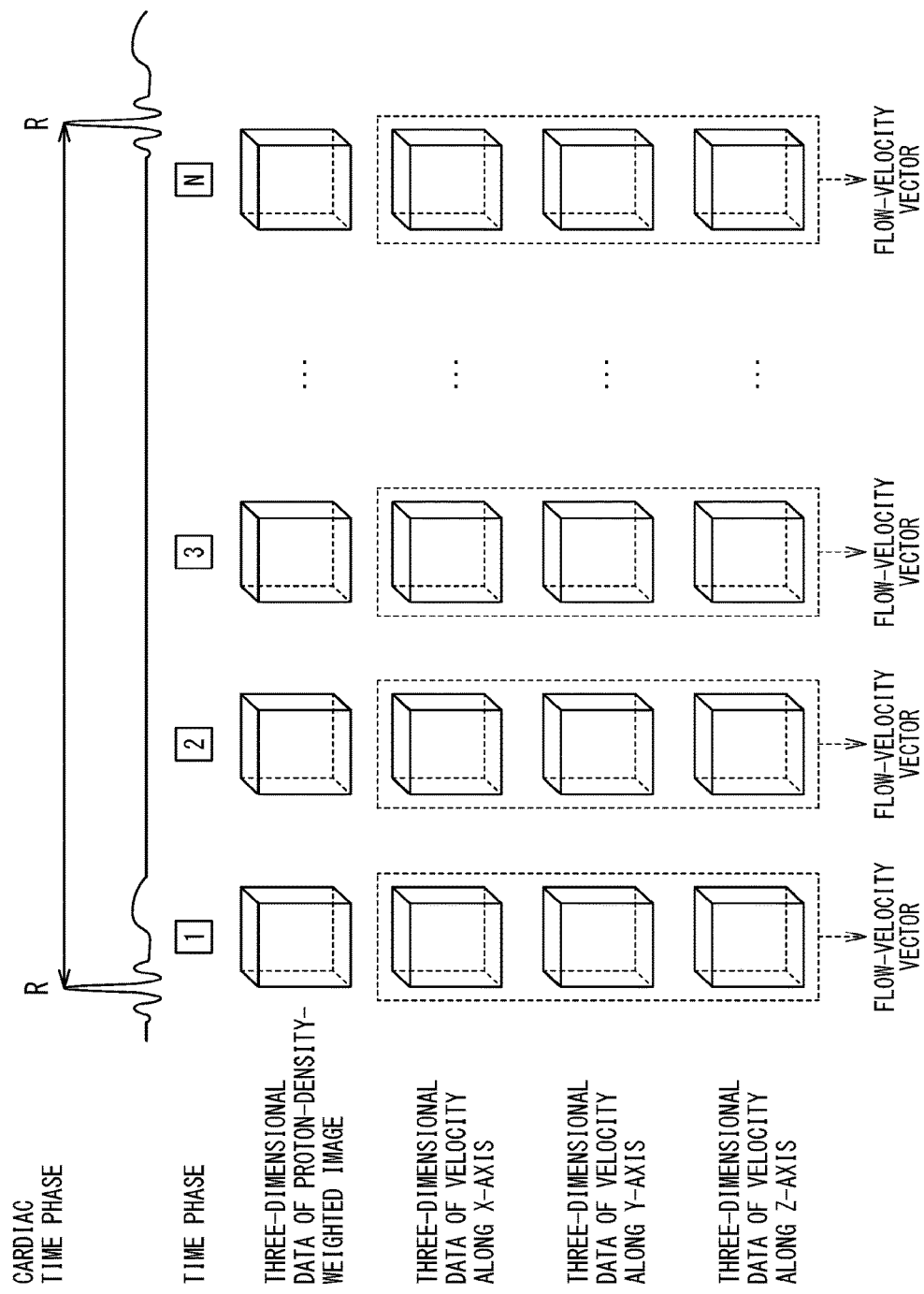
FIG. 4 is a diagram illustrating bloodstream data acquired by Four-Dimensional Flow MRI and a method of calculating a flow-velocity vector.

FIG. 4 is a diagram illustrating bloodstream data acquired by Four-Dimensional Flow MRI and a method of calculating flow-velocity vectors. The topmost part of FIG. 4 illustrates an electrocardiographic waveform. FIG. 4 illustrates a case of acquiring data in each interval between an R-wave and the next R-wave (i.e., R-R interval), out of respective waves observed in an electrocardiographic waveform.

In the example of FIG. 4, respective data sets corresponding to the time phase 1 to the time phase N are acquired in each R-R interval. In each R-R interval, proton density-weighted three-dimensional data, X-axis velocity three-dimensional data, Y-axis velocity three-dimensional data, and Z-axis velocity three-dimensional data are acquired. Velocity encoding is performed for each of the X-axis, Y-axis, and Z-axis by applying bipolar gradient magnetic fields, and velocity three-dimensional data of each of the three axis are acquired based on two phase images whose phases are different from each other. Each of the X-axis velocity three-dimensional data, the Y-axis velocity three-dimensional data, and the Z-axis velocity three-dimensional data include quantitative information on blood-flow-velocity vectors in its axial direction.

Three-dimensional flow-velocity vectors are calculated based on the blood-flow-velocity vectors of each of the three axis acquired in the above manner. As shown in FIG. 4, three-dimensional flow-velocity vectors of respective voxels are calculated for each time phase and thereby four-dimensional bloodstream data including three-dimension velocity vectors and the time phase are acquired.

Incidentally, a proton density-weighted image can be generated from the same data as data used for generating phase images. As mentioned above, Four-Dimensional Flow MRI is an imaging method of acquiring blood velocity information of each axis (i.e., the X-axis, Y-axis, and Z-axis) for each time phase under the phase contrast method. When three-dimensional velocity data of each of the three axes are acquired based on two phase images for the X-axis, other two phase images for the Y-axis, and still other two phase images for the Z-axis, six imaging scans are performed to obtain the above six phase images in total. However, actually, it is enough to perform four imaging scans. This is because an image common to all the three axes can be treated as a reference image (i.e., one of two phase images for each axis) for calculating difference between two phase images. In addition, since each repetition time TR can be shortened to several milliseconds, the total imaging time can be shortened.

As mentioned above, a flow-velocity vector can be acquired by Four-Dimensional Flow MRI. A flow-velocity vector is vector information indicative of bloodstream amount and bloodstream direction for each voxel. As shown in FIG. 4, a flow-velocity vector is calculated for each time phase.

A bloodstream image can be generated based on a flow-velocity vector calculated from bloodstream data acquired in Four-Dimensional Flow MRI. A bloodstream image is an image, in which bloodstream velocity and bloodstream amount are visually depicted, and by which a track of a blood flow can be observed. As mentioned above, a bloodstream image is an image including a result of analyzing bloodstream data acquired by Four-Dimensional Flow MRI. Since blood flow velocity in a branched blood vessel is slow compared with a major blood vessel, it was difficult to detect a track of blood flow in a branched blood and depict such a branched blood vessel in a bloodstream image in conventional technology.

Figure 5:
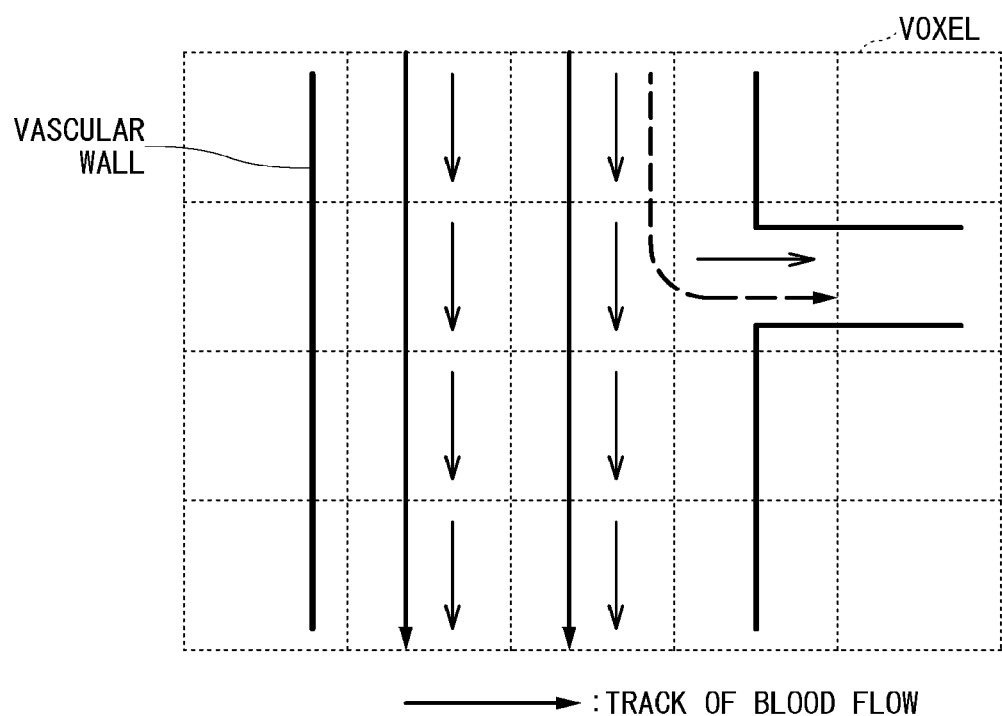
FIG. 5 is a schematic diagram illustrating the reason why a track of a blood flow in a branched blood cannot be observed in conventional technology.

FIG. 5 is a schematic diagram illustrating the reason why a track of blood flow in a branched blood cannot be observed in conventional technology. FIG. 5 illustrates a schematic image which has thickness equal to one voxel and is obtained by projecting voxel data in the direction perpendicular to the travelling direction of blood in a major blood vessel. The above-described traveling direction of blood in a major blood vessel means, for example, an extending direction (i.e., a long-axis direction) of this major blood vessel. The vascular wall illustrated in FIG. 5 is a vascular wall estimated from, for example, a proton-density-weighted image. The arrow in each voxel indicates a flow-velocity vector.

In conventional technology, a track of a blood flow was depicted by connecting flow-velocity vectors of respective voxels with each other. Since each voxel has only one flow-velocity vector, it is impossible to concurrently depict both tracks of the blood flow in the direction illustrated with solid arrows and the blood flow in the direction illustrated with the dashed arrow. As a method of depicting the track of the blood flow of the above branched blood vessel illustrated with the dashed arrow, flow-velocity vectors of respective voxels may be more minutely calculated by downsizing each voxel to enhance spatial resolution. However, in order to enhance spatial resolution, it is required to extend imaging time and longer imaging time is not necessarily desirable.

If a position of a branched blood vessel is not identified, it is difficult to distinguish a flow-velocity vector of small magnitude from noise. Thus, in conventional technology, a bloodstream image was generated by using flow-velocity vectors each of which is equal to or larger in magnitude than a threshold value so that a track of a blood flow in a major blood vessel is depicted.

For the above reason, the magnetic resonance imaging apparatus 1 of the present embodiment generates a bloodstream image by which a track of a blood flow in a branched blood vessel can be observed, by identifying the position of the branched blood vessel based on flow-velocity vectors without enhancing spatial resolution.

Retuning to FIG. 3, the description of the flowchart is continued as follows.

In the step ST105, the first bloodstream image generation function 603a generates the first bloodstream image.

In the step ST107, the display 64 displays the first bloodstream image. The first bloodstream image is an image in which a track of a blood flow is depicted based on flow-velocity vectors each of which has magnitude larger than the first threshold value. In the first bloodstream image, a track of a blood flow of a major blood vessel is depicted.

In the step ST109, the flow-volume calculation function 605 determines the start cross-section of bloodstream analysis and its downstream cross-sections. The start cross-section may be automatically selected based on anatomical information included in a shape image (e.g., a proton-density-weighted image) acquired by Four-Dimensional Flow MRI or an arbitrary cross-section may be selected as the start cross-section by a user via the input circuit 62.

In addition, the start cross-section may be selected from cross-sections in each of which a blood flow is detected based on the first bloodstream image generated by the first bloodstream image generation function 603a. For example, when a track of a blood flow of a major blood vessel is depicted in the first bloodstream image, the medical image processing apparatus 100 may be configured so that a user can determine the start cross-section based on the first bloodstream image displayed on the display 64.

The above-described downstream cross-section is a cross-section positioned on the downstream side of the start cross-section, and respective downstream cross-sections may be automatically selected so as to be perpendicular to the direction of each flow-velocity vector or may be automatically selected based on a shape image.

In the step ST111, an in-plane integral value of flow-velocity vectors of respective voxels in each cross-section is calculated as flow volume of each cross-section by the flow-volume calculation function 605. In other words, an in-plane integral value is calculated for each of short-axis cross-sections in parallel with each other along a traveling direction of blood in a major blood vessel, by integrating flow volume within each cross-section. The above-described short-axis cross-section is a cross-section perpendicular to the traveling direction of blood in the major blood vessel detected in the first bloodstream image, for example.

In the step ST113, the flow-volume determination function 606 repeats determination processing as to whether flow volume of a target short-axis cross-section is smaller than flow volume of another short-axis cross-section adjacent to this target short-axis cross-section on the upstream side or not, for each short-axis cross-section until the determination result becomes positive. In other words, whether flow volume of a target short-axis cross-section is smaller than the short-axis cross-section one before this target short-axis cross-section in the traveling direction of blood of the major blood vessel or not is determined for each of the short-axis cross-sections until the determination result becomes positive.

When the flow volume of the target short-axis cross-section is smaller than the short-axis cross-section one before this target short-axis cross-section (i.e., YES in the step ST113 of FIG. 3), the branched-blood-vessel identification function 604 indentifies that a branched blood vessel exists in this target short-axis cross-section in the step ST115.

On the other hand, when the flow volume of the target short-axis cross-section is not smaller than the short-axis cross-section one before this target short-axis cross-section (i.e, NO in the step ST113 of FIG. 3), the branched-blood-vessel identification function 604 acquires the flow volume of the next short-axis cross-section in the step ST117 and returns to the step ST113 so as to repeat the above-described determination processing.

In the step ST119, the second bloodstream image generation function 603b generates the second bloodstream image based on the position of the branched blood vessel identified by the branched-blood-vessel identification function 604. The second bloodstream image is generated based on the second threshold value being smaller than the first threshold value, for example. By applying the second threshold value smaller than the first threshold value to the short-axis cross-section identified as a cross-section where a branched blood vessel exists, the second bloodstream image in which the track of the blood flow of the branched blood vessel is depicted can be generated.

In the step ST121, the display 64 displays the second bloodstream image.

Figure 6A:
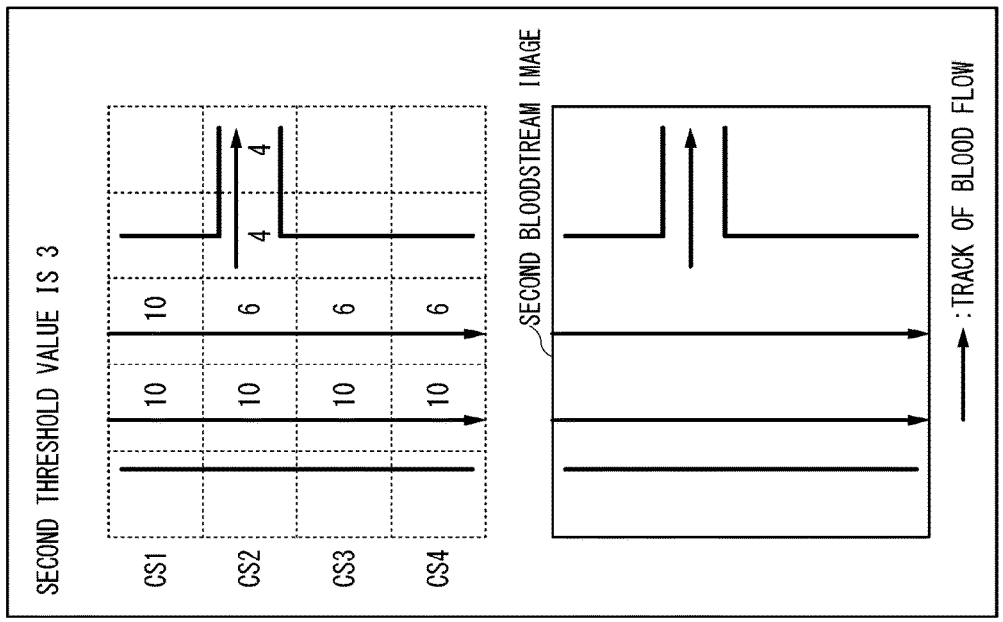
FIG. 6A and FIG. 6B are schematic diagrams illustrating a method of identifying a branched blood vessel in the first embodiment.
Figure 6B:
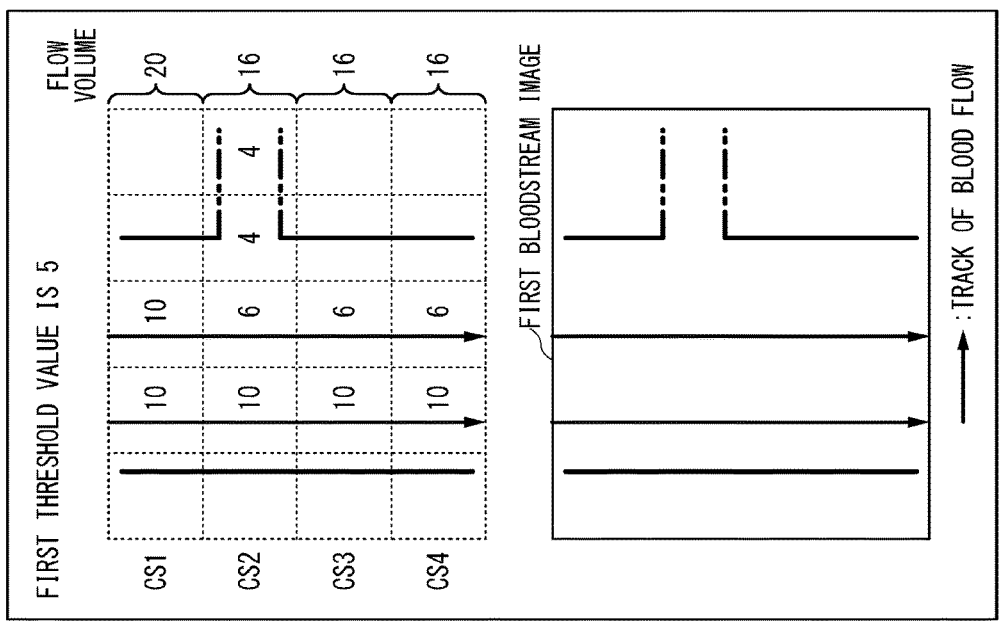

FIG. 6A and FIG. 6B are schematic diagrams illustrating a method of identifying a branched blood vessel in the first embodiment. The upper part of each of FIG. 6A and FIG. 6B illustrates a view of flow-velocity vectors of respective voxels from a direction perpendicular to the traveling direction of blood of a major blood vessel. The upper part of FIG. 6A illustrates a method of generating the first bloodstream image, and the upper part of FIG. 6B illustrates a method of generating the second bloodstream image. The lower part of FIG. 6A illustrates an example of the first bloodstream image, and the lower part of FIG. 6B illustrates an example of the second bloodstream image.

The value in each voxel in the upper part of FIG. 6A indicates magnitude of the flow-velocity vector of the voxel. In the first bloodstream image, a track of a blood flow is depicted based on flow-velocity vectors each of which has magnitude larger than 5 as the first threshold value. Thus, each voxel whose flow-velocity vector has magnitude smaller than 5 is not depicted as a part of a blood vessel region in the first bloodstream image. In the example of the upper part of FIG. 6A, magnitude of the flow-velocity vector of each of the two voxels on the right side of the second row from the top is 4 and these two voxels are not displayed in a bloodstream image. In this manner, an image in which only the track of the blood flow of the major blood vessel is depicted like the lower part of FIG. 6A is generated.

Here, the upper part of FIG. 6A illustrates a schematic image which includes 4 rows and 5 columns of voxels and has thickness corresponding to thickness of one voxel, and it is assumed that a short-axis cross-section CS1 is the topmost row in the image of the upper part of FIG. 6A. Similarly, it is assumed that a short-axis cross-section CS2 is the second top row, a short-axis cross-section CS3 is the third top row, and the a short-axis cross-section CS4 is the bottom row in the image of the upper part of FIG. 6A.

The branched-blood-vessel identification function 604 determines each of the short-axis cross-sections CS1 to CS4 based on the first bloodstream image, and then the flow-volume calculation function 605 calculates flow volume of the major blood vessel for each of the short-axis cross-sections CS1 to CS4 by integrating flow-velocity vectors each of which is larger than the first threshold value 5.

In the case of the short-axis cross-section CS1, magnitude values of flow-velocity vectors of the five voxels are respectively 0, 10, 10, 0, and 0 in the order from the left. Thus, the flow volume of the short-axis cross-section CS1 subjected to the threshold processing is determined as 20. In the case of the short-axis cross-section CS2, magnitude values of flow-velocity vectors of the five voxels are respectively 0, 10, 6, 4, and 4. However, magnitude values of flow-velocity vectors of two voxels are 4 and these two voxels are eliminated by the threshold processing. Thus, the flow volume of the short-axis cross-section CS2 subjected to the threshold processing is determined as 16. Similarly, the flow volume of the short-axis cross-section CS3 subjected to the threshold processing is determined as 16, and the flow volume of the short-axis cross-section CS4 subjected to the threshold processing is determined as 16.

Accordingly, the flow-volume determination function 606 determines that the flow volume of the short-axis cross-section CS2 is smaller than the short-axis cross section one before the short-axis cross-section CS2 in the travelling direction of blood of the major blood vessel (i.e., the short-axis cross-section CS1). As a result, the branched-blood-vessel identification function 604 identifies that a branched blood vessel branches from the major blood vessel at the short-axis cross-section CS2. As shown in the upper part of FIG. 6B, the second bloodstream image generation function 603b executes threshold processing on flow-velocity vectors of the first bloodstream image by using the second threshold value 3 being smaller than the first threshold value 5 so as to generate the second bloodstream image. In this manner, the track of the blood flow of the branched blood vessel is depicted in the second bloodstream image as shown in the lower part of FIG. 6B.

A case of generating the second bloodstream image when one branched blood vessel is identified has been described in the above-described operation. However, embodiments of the present invention are not limited to such an aspect. As another example, a branching point and an extending region of every branched blood vessel of the first bloodstream image may be identified, and then the second bloodstream image may be generated so that all the identified branched blood vessels are depicted.

As mentioned above, existence of a branched blood vessel is determined for each short-axis cross-section and thereby the second bloodstream image in which a branched blood vessel is depicted is generated. Although a method of identifying a branched blood vessel by determining short-axis cross-sections along the traveling direction of blood of the major blood vessel has been described in the example of FIG. 3, this is only one example. As another example, still another branched blood vessel branching from the identified branched blood vessel may be identified by repeating similar processing in which short-axis cross-sections are determined again along the traveling direction of this identified branched blood vessel and flow volume is compared between two short-axis cross-sections adjacent to each other so as to detect the branching point.

Figure 7A:
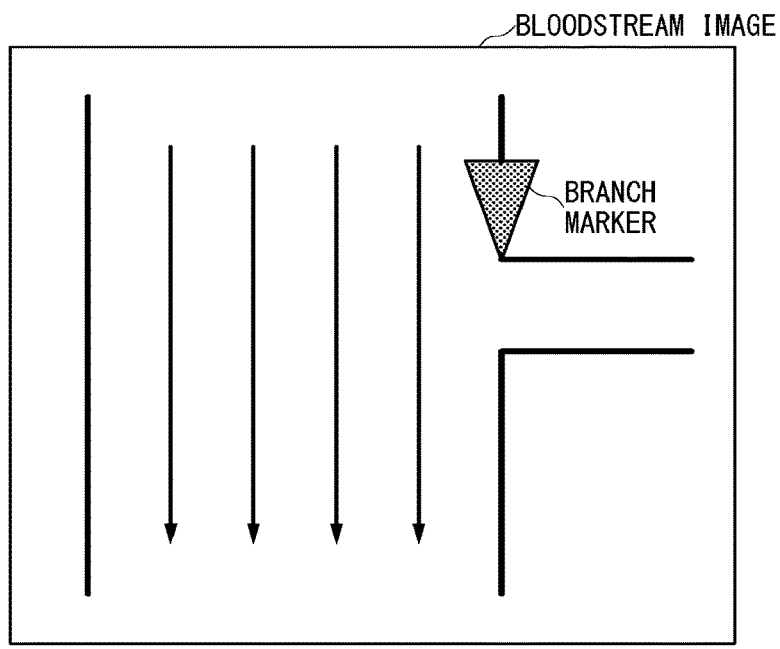
FIG. 7A and FIG. 7B are schematic diagrams illustrating examples of displaying a branched blood vessel in a bloodstream image.
Figure 7B:
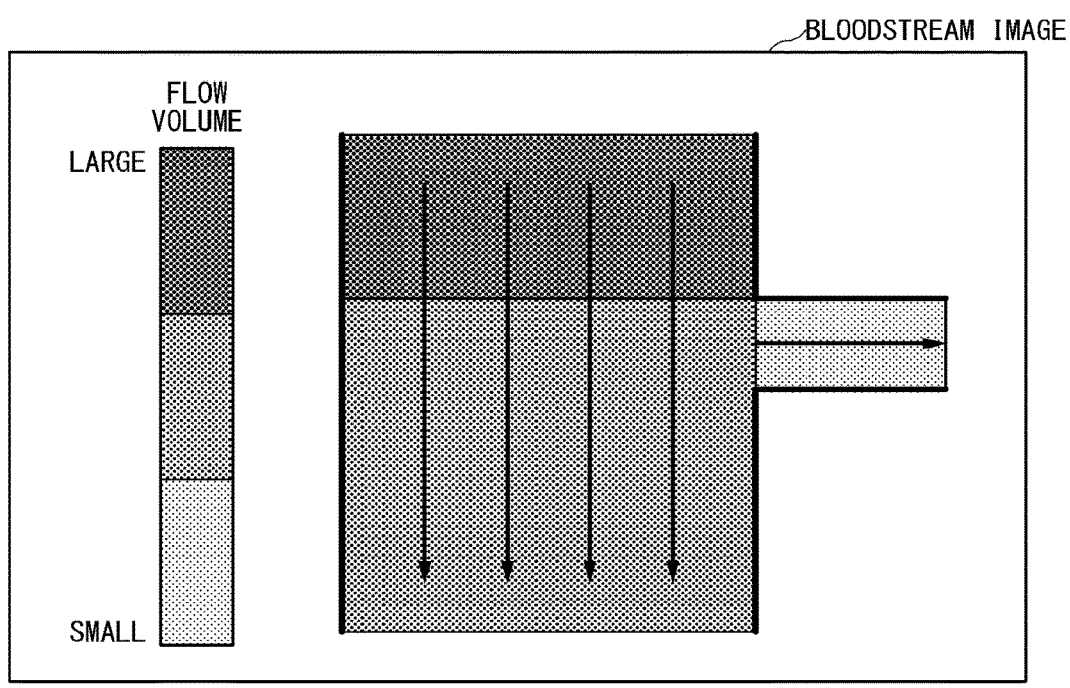

FIG. 7A and FIG. 7B are schematic diagrams illustrating examples of displaying a branched blood vessel in a bloodstream image.

FIG. 7A illustrates an example in which a branch marker is displayed at the position where existence of a branched blood vessel is identified. For example, a branch marker may be superimposed on the first bloodstream image so that the position of the branch point is distinguishably displayed. Additionally, a branch marker may be superimposed on the second bloodstream image. Moreover, a branch point of a branched blood vessel may be displayed by a symbol or a figure instead of the arrow-type branch marker shown in the upper part of FIG. 7A.

As another example, the second bloodstream image generation function 603b generates the second bloodstream image based by assigning the first chromatic color to the major blood vessel and assigning second chromatic color to the branched blood vessel, and causes the display 64 to display such a second bloodstream image. In this manner, the major blood vessel and the branched blood can be distinguished from each other by assigning different chromatic colors to respective blood vessels.

FIG. 7B illustrates an example in which a color of each short-axis cross-section is determined depending on the flow volume of this short-axis cross-section and the determined colors are assigned to respective short-axis cross-sections. FIG. 7B illustrates an example in which a darker color is assigned to a short-axis cross-section with larger flow volume. Although the flow volume of the short-axis cross-section CS1 in the upper part of FIG. 6B is 20, each of the short-axis cross-sections CS2 to CS4 on the downstream side of the short-axis cross-section CS1 is reduced to 16. In addition, the flow volume of the branched blood vessel becomes the minimum value. A region with larger flow volume can be observed at one view by assigning colors changing depending on flow volume. In addition, a branched blood vessel can be clearly identified by difference in color.

Further, each short-axis cross-section may be divided into plural regions and determination as to whether the sum of magnitude values of flow-velocity vectors in one region is decreased in its adjacent region or not may be executed so that a position of a branched blood vessel is identified in a similar manner as described above. Moreover, a position of a branched blood vessel may be identified based on whether flow volume calculated from flow-velocity vectors changes between two cross-sections adjacent to each other or not.

According to the above-described method, a track of a blood flow of a branched blood vessel can be displayed by identifying a position of a branched blood vessel based on difference in flow volume and changing a threshold value used for generating a bloodstream image. However, a method of identifying a position of a branched blood vessel is not limited to the above-described method based on flow volume. As another example, a position of a branched blood vessel can be identified based on each component of a flow-velocity vector such as a travelling direction component and a vertical component whose direction is perpendicular to a travelling direction of blood.

Hereinafter, a method of identifying a position of a branched blood vessel based on respective components of a flow-velocity vector will be described as a modification of the first embodiment.

Figure 8:
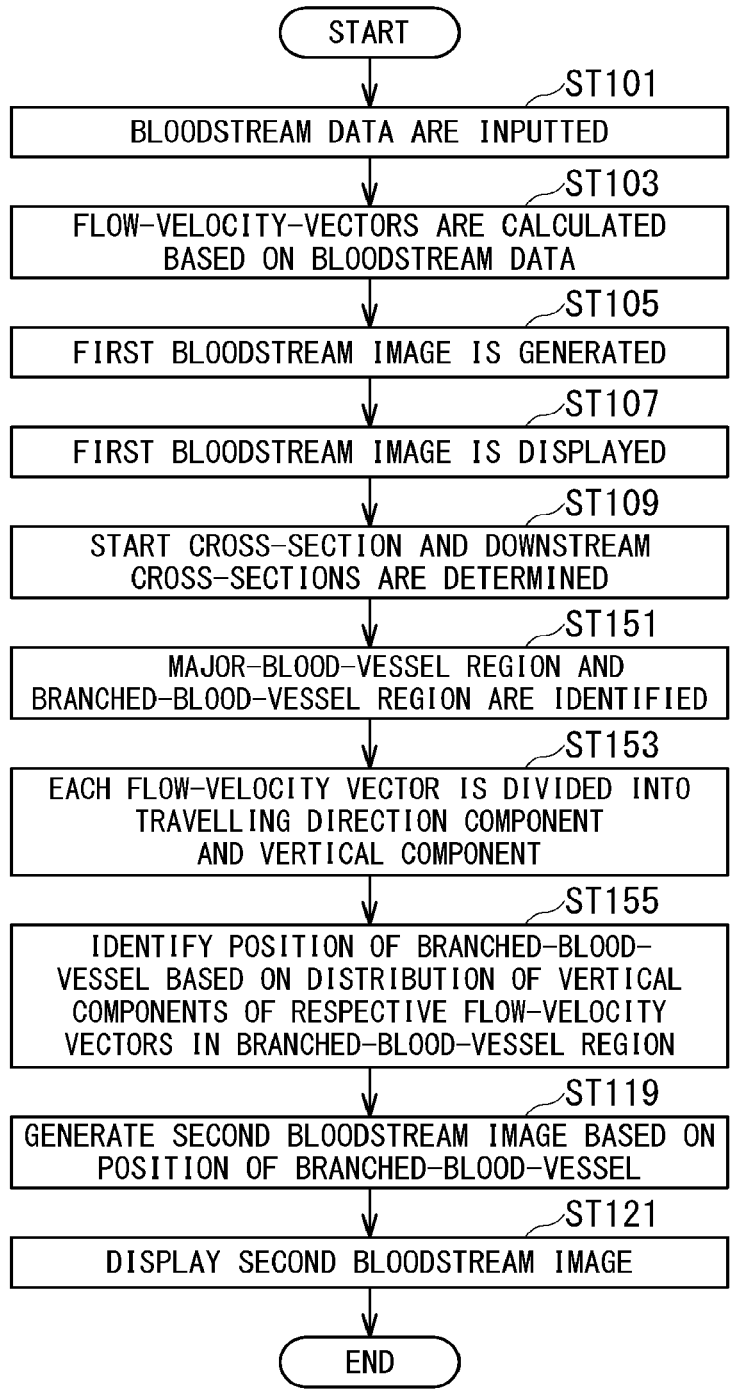
FIG. 8 is a flowchart illustrating an example of an operation in a modification of the first embodiment.

FIG. 8 is a flowchart illustrating an example of an operation of the modification of the first embodiment. In FIG. 8, the identical reference number is given for the same step as that in FIG. 3, and duplicate description is omitted.

In the step ST151, the range identification function 607 identifies a major-blood-vessel region and a branched-blood-vessel region.

In the step ST153, the branched-blood-vessel identification function 604 divides each flow-velocity vector into a travelling direction component and a vertical component. The travelling direction component is, for example, a component of a flow-velocity vector along an extending direction (i.e., a long-axis direction) of a major blood vessel, and the vertical component is a component perpendicular to this travelling direction component.

Figure 9:
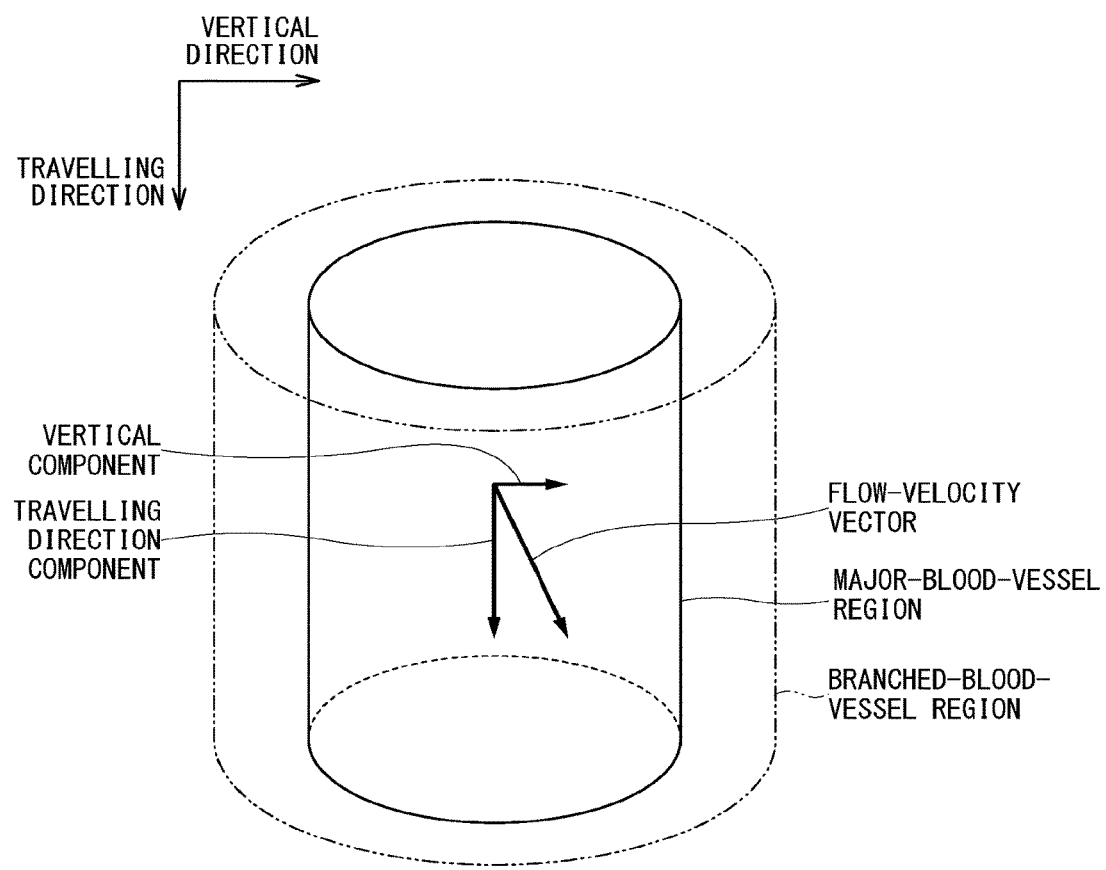
FIG. 9 is a schematic perspective view illustrating a major-blood-vessel region and a branched-blood-vessel region.

FIG. 9 is a schematic perspective view illustrating a major-blood-vessel region and a branched-blood-vessel region. In the example of FIG. 9, the inner region drawn by a solid line is a major-blood-vessel region, and the outer region drawn by two-dot chain line is a branched-blood-vessel region. The major-blood-vessel region may be, for example, an exterior edge of the region where a track of a blood flow is observed in the first bloodstream image or an outline of a region which is anatomically identified to be a major blood vessel from images such as a proton-density-weighted image. The branched-blood-vessel region is identified as a region which exists outside the major-blood-vessel region.

The branched-blood-vessel identification function 604 divides every flow-velocity vector included in three-dimensional image data into (a) a traveling direction component whose direction is in parallel with a traveling direction of a blood of a major blood vessel and (b) a vertical component whose direction is perpendicular to the travelling direction. FIG. 9 illustrates an example in which a flow-velocity vector of a certain cross-section is divided into a traveling direction component and a vertical component.

Returning to FIG. 8, description of the flowchart is continued.

In the step ST155, the branched-blood-vessel identification function 604 identifies a position of a branched blood vessel, based on distribution of vertical components of respective flow-velocity vectors in a branched-blood-vessel region. Since a branched blood vessel is characterized by extending approximately along a direction perpendicular to the traveling direction of its major blood vessel, a position of a branched blood vessel can be identified based on distribution of vertical components divided from flow-velocity vectors.

Figure 10:
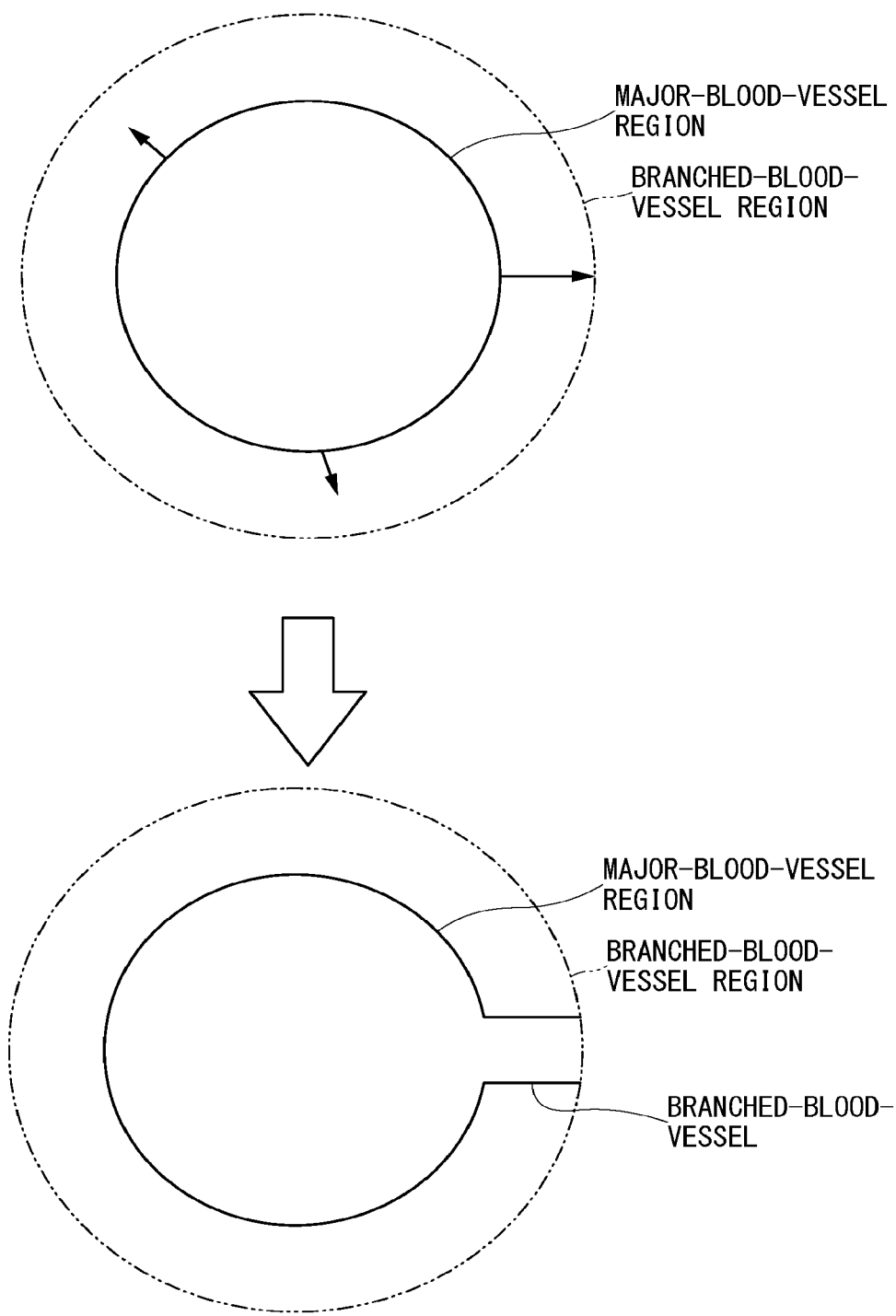
FIG. 10 is a schematic diagram illustrating a method of identifying a branched blood vessel in the modification of the first embodiment.

FIG. 10 is a schematic diagram illustrating a method of identifying a branched blood vessel in the modification of the first embodiment. The upper part of FIG. 10 illustrates a cross-section of the schematic perspective view shown in FIG. 9 when viewed from the top side in the traveling direction. As shown in the upper part of FIG. 10, plural vertical components are observed in a cross-section of a certain branched-blood-vessel region. Out of those plural vertical components, a position of a vertical component whose magnitude is equal to or larger than a threshold value is identified as a position of a branched blood vessel as an example. Then, on the basis of the position of a branched blood vessel identified in the above manner, the second bloodstream image is generated as shown in the lower part of FIG. 10.

In addition, it is not necessarily required to use all the flow-velocity vectors included in a cross-section. For example, a position of a branched blood vessel may be indentified based on distribution of vertical component of respective flow-velocity vectors included in a branched-blood-vessel region and its peripheral regions.

Although a case of using flow-velocity vectors calculated for each time phase has been described in the above-described embodiment, embodiments of the present invention are not limited to such an aspect. As another example, an accumulated flow-velocity vector obtained by integrating flow-velocity vectors of all the time phases may be used. In the case of using an accumulated flow-velocity vector, a branched blood vessel can be identified and the second bloodstream image can be generated in a manner similar to the first embodiment and its modification. By using the above-described accumulated flow-velocity vector, difference between a stationary tissue (e.g., a region of stagnating blood) and a region where blood flows can be more clarified and detection accuracy of a region where blood flows can be improved.

In other words, the medical image processing apparatus 100 of the present embodiment identifies a position of a branched blood vessel based on flow-velocity vectors and then applies threshold processing on flow-velocity vectors in the cross-section identified as a region of a branched blood vessel using a changed threshold value so as to generate a bloodstream image by which a branched blood vessel can be observed, without enhancing spatial resolution. Accordingly, in the present embodiment, a bloodstream image by which a branched blood vessel can be observed can be generated based on bloodstream data acquired in the same method as conventional technology.

Second Embodiment

The second embodiment relates to a method of (a) determining whether plural trace methods can be applied or not based on flow-velocity vectors and (b) tracing a track of a blood flow according to this determination result.

(1) Configuration

Figure 11:
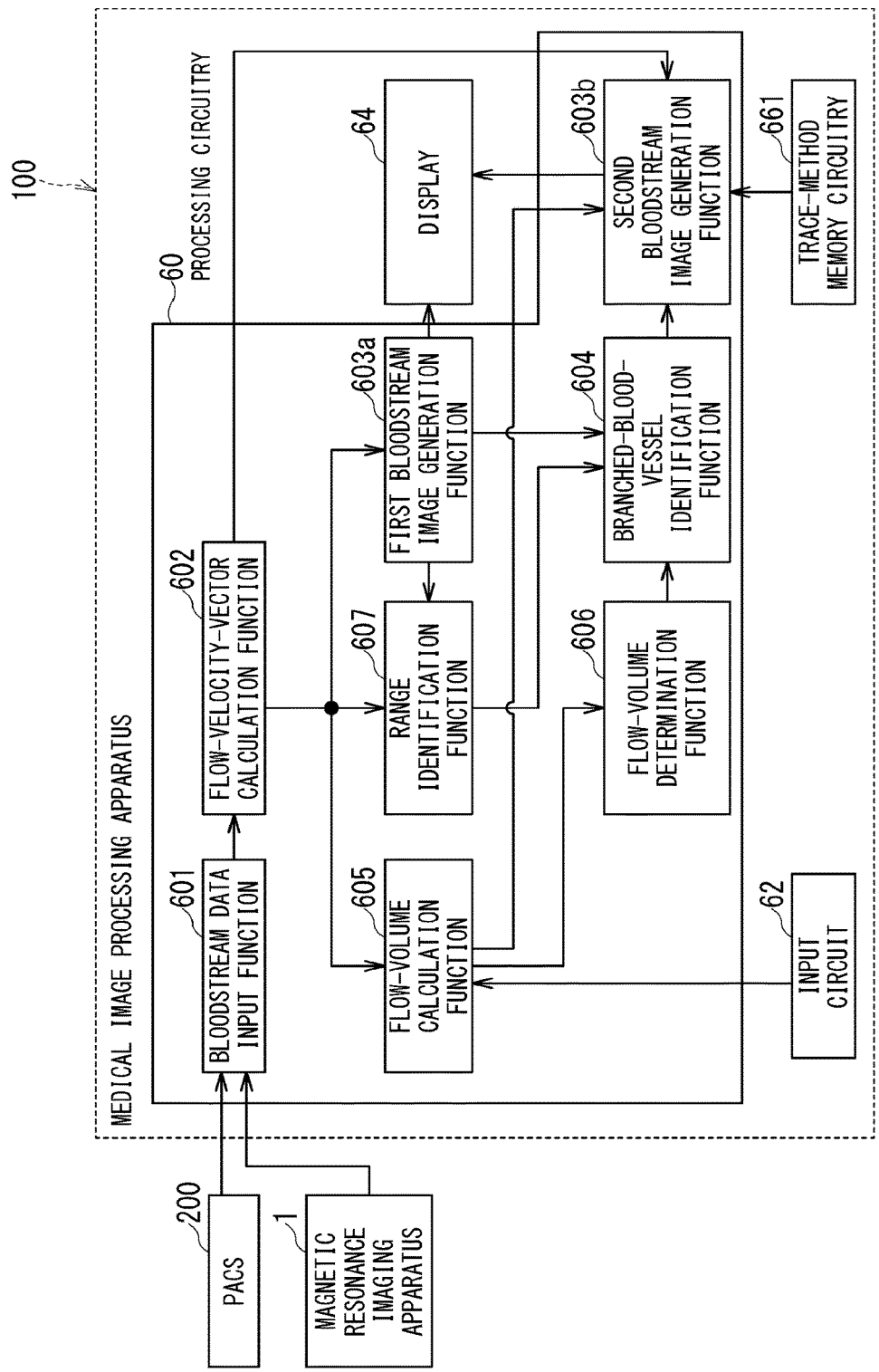
FIG. 11 is a functional block diagram illustrating an example of configuration of the medical image processing apparatus in the second embodiment.

FIG. 11 is a functional block diagram illustrating an example of configuration of the medical image processing apparatus 100 in the second embodiment. In FIG. 11, the identical reference number is given for the same components as the first embodiment, and duplicate description is omitted. As shown in FIG. 11, configuration of the medical image processing apparatus 100 in the second embodiment is the same as that in the first embodiment except that the medical image processing apparatus 100 in the second embodiment further includes trace-method memory circuitry 661.

The trace-method memory circuitry 661 stores plural trace methods for depicting a track of a blood flow.

For example, the first trace method of the plural trace methods is a method of linearly tracing a track of a blood flow of a target short-axis cross-section so that flow-velocity vectors of the target short-axis cross-section are perpendicular to the short-axis cross-section adjacent to the target short-axis cross-section on the upstream side in the traveling direction of the major blood vessel (hereinafter, the short-axis cross-section adjacent to the target short-axis cross-section on the upstream side, i.e., the short-axis cross-section one before in the traveling direction of a major blood vessel is shortly referred to as the adjacent short-axis cross-section on the upstream side).

As another example, the second trace method is a method of tracing a track of a blood flow of a target short-axis cross-section so that the flow volume of the target short-axis cross-section does not change from the flow volume of its adjacent short-axis cross-section on the upstream side.

As still another example, the third trace method is a method of tracing a track of a blood flow so that the direction of the flow-velocity vectors of the target short-axis cross-section becomes the same as the direction of the flow-velocity vectors of the adjacent short-axis cross-section on the upstream side.

The second bloodstream image generation function 603b generates the second bloodstream image based on whether plural trace methods can be applied to flow-velocity vectors of plural short-axis cross-sections or not. As a generation method of the second bloodstream image based on a trace method, it will be described below.

(2) Operation

Figure 12:
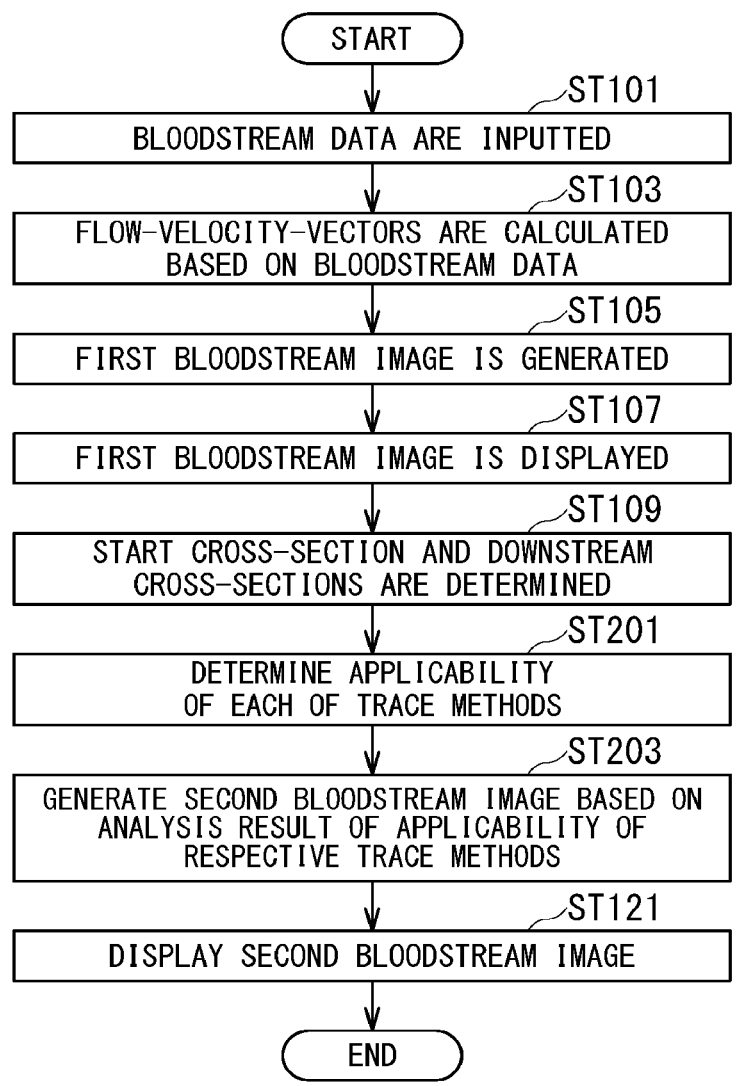
FIG. 12 is a flowchart illustrating an example of an operation performed by the medical image processing apparatus of the second embodiment.

FIG. 12 is a flowchart illustrating an example of an operation performed by the medical image processing apparatus 100 of the second embodiment. In FIG. 12, the identical reference number is given for the same processing as that in FIG. 3 of the first embodiment, and duplicate description is omitted.

In the step ST201, the second bloodstream image generation function 603b determines applicability of each of the trace methods stored in the trace-method memory circuitry 661.

For example, the second bloodstream image generation function 603b determines whether the above-described first trace method can be applied to flow-velocity vectors of a target short-axis cross-section or not. When the direction of the flow-velocity vectors of the target short-axis cross-section is substantially equal to the direction of the normal line of the adjacent short-axis cross-section on the upstream side, a track of a blood flow is straight. When plural short-axis cross-section are set so as to become perpendicular to the traveling direction of blood of the major cross-section, it is considered that the first trace method can be applied to many short-axis cross-sections. On the other hand, when the direction of the flow-velocity vectors of the target short-axis cross-section is not perpendicular to the adjacent short-axis cross-section on the upstream side, i.e., when the first trace method cannot be applied to the flow-velocity vectors of the target short-axis cross-section, a penalty is counted up for the first trace method.

As another example of counting up a penalty, a stepwise penalty may be counted up for a tracing method determined to be unable to be applied to a target short-axis cross-section, by dividing a penalty into plural degrees based on an angle of the direction of each flow-velocity vector of the target short-axis cross-section with respect to the adjacent short-axis cross-section on the upstream side (i.e., based on degree of difference between both).

In the step ST203, the second bloodstream image is generated according to the determination result as to applicability of plural trace methods determined by the second bloodstream image generation function 603b in the step ST201. According to the total penalty counted up based on the plural trace methods, the second bloodstream image is generated by (a) selecting a trace method to which trace methods can be applied with the lowest total penalty and (b) depicting a track of a blood flow by the selected trace method.

FIG. 13A and FIG. 13B illustrate a method of generating the second bloodstream image in the second embodiment. FIG. 13A is a table illustrating schematic diagrams of the first to third trace methods.

For example, when a track of a blood flow of a flow-velocity vector shown in FIG. 13B is traced by the third trace method so that the track becomes in parallel with the flow-velocity vector of the adjacent short-axis cross-section on the upstream side, a penalty is counted up for the first trace method.

By contrast, when a track of a blood flow of the flow-velocity vector shown in FIG. 13B is traced by the first trace method so that the flow-velocity vector of the target short-axis cross-section becomes perpendicular to the adjacent short-axis cross-section on the upstream side, a penalty is counted for the third trace method.

Note that only one of the stored trace methods is applied to the tracing processing between the current target short-axis cross-section and the adjacent short-axis cross-section on the upstream side. This process is repeated by changing the current target short-axis cross-section to the next short-axis cross-section which is adjacent to the current target short-axis target cross-section on the downstream side.

There are many combination patterns of applying the trace methods between respective short-axis cross-sections. As the first combination pattern, for example, the first trace method is applied between the short-axis cross-sections CS1 and CS2, the second trace method is applied between the short-axis cross-sections CS2 and CS3, the third trace method is applied between the short-axis cross-sections CS3 and CS4. As the second combination pattern, for example, the third trace method is applied between the cross-sections CS1 and CS2, the first trace method is applied between the cross-sections CS2 and CS3, the second trace method is applied between the cross-sections CS3 and CS4.

The total penalty is calculated for each of possible combination patterns of applying the trace methods as described above, then the combination pattern whose total penalty is the minimum is selected, and then a track of a blood flow is depicted by the selected combination pattern.

The foregoing is the method of tracing the blood flow and generating the second bloodstream image in the second embodiment. Hereinafter, supplementary notes on the second embodiment will be described.

The second trace method is a method in which a track of a blood flow is traced based on a method of identifying a branched blood vessel in accordance with flow volume described in the first embodiment. For example, when a track of a blood flow is traced by the first trace method and the flow volume in the target short-axis cross-section changes from the adjacent short-axis cross-section on the upstream side in the second method, a penalty is counted up for the second method. When the flow volume in the target short-axis cross-section changes from the adjacent short-axis cross-section on the upstream side, a branched blood vessel exists in the target short-axis cross-section in some cases. When a branched blood vessel exists in the target short-axis cross-section and a track of a blood flow is traced in such a manner that the flow volume in the target short-axis cross-section does not change from the adjacent short-axis cross-section on the upstream side, the penalty of the first method increases.

The second bloodstream image including a branched blood vessel can be generated by tracing a track of a blood flow so that the following two conditions are satisfied. The first condition is that the flow volume does not change between the target short-axis cross-section and its adjacent short-axis cross-section on the upstream side in consideration of existence of the branched blood vessel. The second condition is that the penalty of the first trace method becomes the minimum.

Incidentally, aside from the three trace methods illustrated in FIG. 13A, the trace method described in the modification of the first embodiment may be used.

In addition, an applicability degree may be calculated for each trace method and a track of a blood flow may be traced so that the sum of applicability degrees of respective trace methods is maximized. Further, instead of applying all the trace methods, a track of a blood flow may be traced by using only one trace method whose penalty is the minimum. Moreover, weighted addition of respective trace methods may be performed. For example, when an applicability degree of a certain trace method is very high, i.e., the penalty of a certain trace method is very low, the weight of the penalty of each of other trace methods may be increased. As mentioned above, weights of respective trace methods may be changed by setting degree of importance to respective trace methods according to a penalty and other factors.

Although the medical image processing apparatus 100 capable of depicting a track of a blood flow of a branched blood vessel by identifying the branched blood vessel based on flow-velocity vectors has been described above, embodiments of the present invention are not limited to such an aspect. For example, embodiments of the present invention can be applied to a magnetic resonance imaging apparatus.

Figure 14:
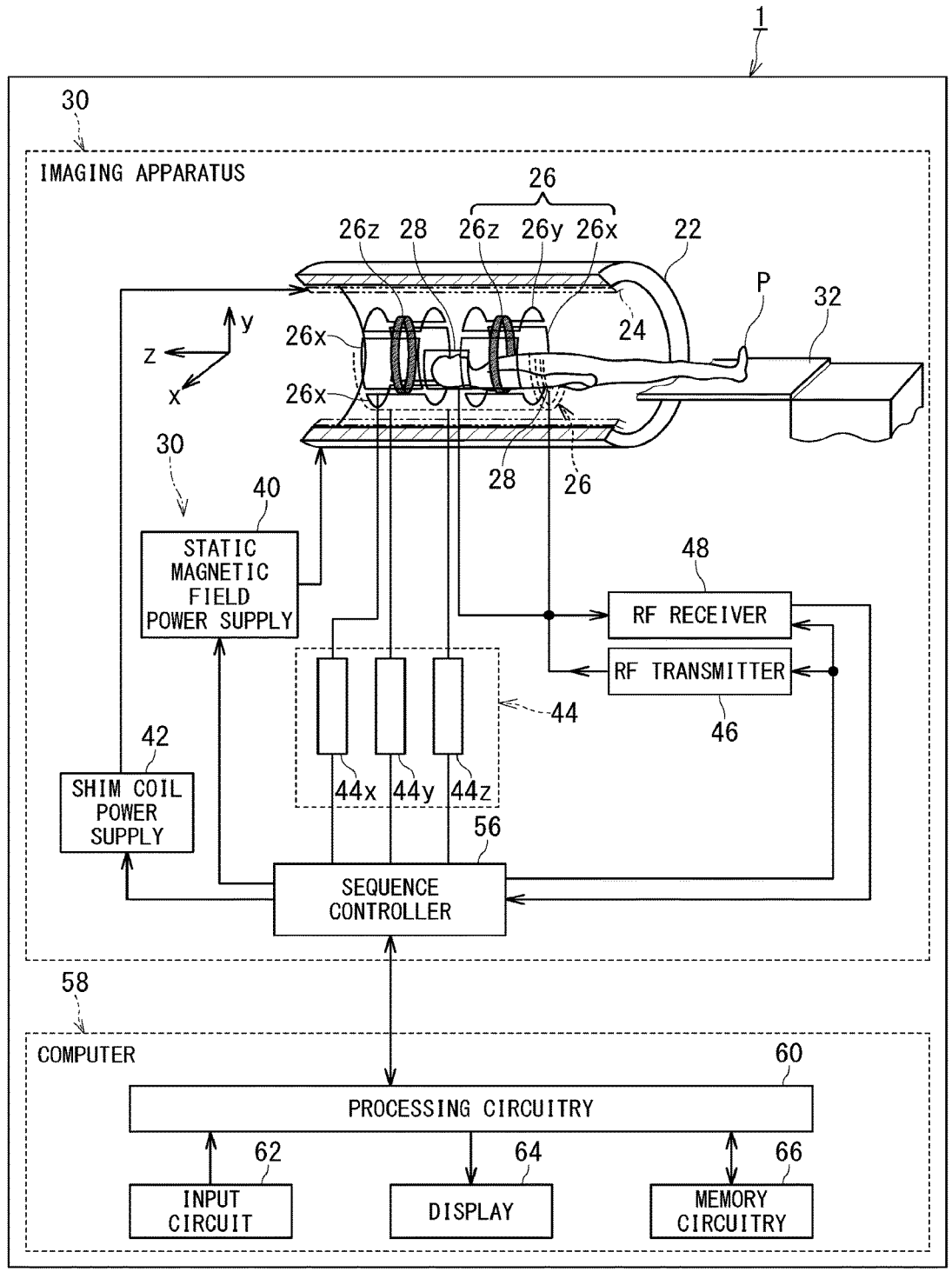
FIG. 14 is a block diagram illustrating an example of conceptual configuration of a magnetic resonance imaging apparatus of one embodiment.

FIG. 14 is a block diagram illustrating an example of conceptual configuration of a magnetic resonance imaging apparatus of one embodiment. As shown in FIG. 14, the magnetic resonance imaging apparatus 1 includes an imaging apparatus 30 and a computer 58.

The imaging apparatus 30 includes a static magnetic field magnet 22, a shim coil 24, a gradient coil 26, an RF coil 28 for applying RF pulses and/or receiving MR signals, a bed 32 for loading an object P (i.e., a patient) thereon, a static magnetic field power supply 40, a shim coil power supply 40, a gradient coil power supply 44, an RF transmitter 46, an RF receiver 48, and a sequence controller 56.

The computer 58 includes internal components such as processing circuitry 60, an input circuit 62, a display 64, and memory circuitry 66.

The static magnetic field magnet 22 is shaped in the form of a cylinder as an example and is connected to the static magnetic field power supply 40. The static magnetic field magnet 31 forms a static magnetic field in an imaging space by using an electric current supplied from the static magnetic field power supply 40.

The static magnetic field magnet 22 is configured as a superconductive coil in many cases and supplied with the electric current supplied from the static magnetic field power supply 40 in its excitation mode. After this, the static field magnet 10 shifts to a permanent current mode and the static magnetic field power supply 30 is separated from the static magnetic field magnet 22 in general.

Note that the static magnetic field power supply 40 may be omitted by configuring the static magnetic field magnet 31 as a permanent magnet.

The shim coil 24 is shaped in the form of a cylinder as an example and arranged inside the static magnetic field magnet 22 so as to become coaxial with the static magnetic field magnet 22. The shim coil 24 is connected to the shim coil power supply 40 and forms an offset magnetic field which uniforms the static magnetic field by using electric currents supplied from the shim coil power supply 40.

The gradient coil power supply 44 is composed of an X-axis gradient coil power supply 44$x$, a Y-axis gradient coil power supply 44$y$, and a Z-axis gradient coil power supply 44$z$. In FIG. 14, it is assumed that the Z axis direction is the direction of the axis of the static magnetic field magnet 22 and the shim coil 24, the Y axis is the vertical direction, and the X axis is the direction perpendicular to these Y axis and Z axis.

The gradient coil 26 includes an X-axis gradient coil 26$x$, a Y-axis gradient coil 26$y$, and the Z-axis gradient coil 26$z$, and shaped in the form of a cylinder inside the static magnetic field magnet 22. The X-axis gradient coil 26$x$, the Y-axis gradient coil 26$y$, and the Z-axis gradient coil 26$z$ are respectively connected to the X-axis gradient coil power supply 44$x$, the Y-axis gradient coil power supply 44$y$, and the Z-axis gradient coil power supply 44$z$.

The X-axis gradient coil 26$x$ forms a gradient magnetic field Gx in the X-axis direction in an imaging space according to an electric current supplied from X-axis gradient coil power supply 44x. Similarly, the Y-axis gradient coil 26y forms a gradient magnetic field Gy in the Y-axis direction in the imaging space according to an electric current supplied from Y-axis gradient coil power supply 44y. Similarly, the Z-axis gradient coil 26y forms a gradient magnetic field Gz in the Z-axis direction in the imaging space according to an electric current supplied from Z-axis gradient coil power supply 44y.

Thereby, directions of a gradient magnetic field Gss in a slice selection direction, a gradient magnetic field Gpe in a phase encode direction, and a gradient magnetic field Gro in a readout (i.e., frequency encode) direction can be arbitrarily selected as logical axes, by combining the gradient magnetic fields Gx, Gy and Gz in the three physical axes of the apparatus coordinate system. Each of the gradient magnetic field Gss in the slice selection direction, the gradient magnetic field Gpe in the phase encoding direction, and the gradient magnetic field Gro in the readout direction is superimposed on a static magnetic field.

The RF transmitter 48 generates RF pulses of the Larmor frequency for causing nuclear magnetic resonance based on control information inputted from the sequence controller 56, and outputs the generated RF pulses to the RF coil 28.

The sequence controller 56 includes a non-illustrated processor and a memory circuit, and stores various pulse sequences corresponding to various imaging methods. A pulse sequence is control information defining generation of RF pulses and control of gradient magnetic fields.

A whole body coil equipped with both functions of applying RF pulses and receiving MR (Magnetic Resonance) signals from an object may be used as the RF coil 28. In addition, a receive-only surface coil (which is also referred to as a local coil) disposed on the bed 32 or adjacent to the object may also be used as an RF coil. MR signals received by the RF coil 28 and a local coil are inputted to the RF receiver 48 via a signal cable.

The RF receiver 48 generates raw data which are digitized complex number data of MR signals obtained by performing various types of signal processing such as preamplification, intermediate-frequency conversion, phase detection, low-frequency amplification, and filtering on the received MR signals and then performing A/D (analogue to digital) conversion on them. The RF receiver 48 outputs the generated raw data of MR signals to the sequence controller 56.

The sequence controller 56 generates gradient magnetic fields Gx, Gy, and Gz and RF pulses according to predetermined imaging conditions and pulse sequences stored in the memory circuitry 66 of the computer 58 and a command inputted from the processing circuitry 60 based on these imaging conditions and pulse sequences.

In addition, the sequence controller 56 acquires MR signals received in response to the gradient magnetic fields Gx, Gy, and Gz and RF pulses from the RF receiver 48, and outputs the acquired MR signals to the processing circuitry 60.

The processing circuitry 60 includes circuit components such as a processor. The processing circuitry 60 preforms system control of the entirety of the magnetic resonance imaging apparatus 1, and generates image data of an object by performing image reconstruction processing including inverse Fourier conversion and various types of image processing on the inputted raw data of MR signals. The generated image data are displayed as images on the display 64. The processing circuitry 60 further includes a communication control circuit. The processing circuitry 60 may download some or all of programs and data to be stored in the memory circuitry 66.

The input circuit 62 provides a user with a function of inputting imaging conditions and various types of information relevant to imaging.

The magnetic resonance imaging apparatus 1 of the present embodiment includes a non-illustrated electrocardiograph and performs Four-Dimensional Flow MRI so as to acquire bloodstream data in which four-dimensional vector information composed of velocity vectors in a three-dimensional image and the time phase of this three-dimensional image is included.

The raw data acquired by a pulse sequence of Four-Dimensional Flow MRI are inputted to the processing circuitry 60 via the sequence controller 56, and the processing circuitry 60 generates bloodstream data using the inputted raw data.

Although examples of applying the technology of the present disclosure to the medical image processing apparatus 100 have been described in the first and second embodiments, the computer 58 in FIG. 14 implements functions of executing various types of image processing and displaying images and has the same functions as the medical image processing apparatus 100 of the above-described embodiments. Thus, the computer 58 of the magnetic resonance imaging apparatus 1 can perform the same operation as that described in the first and second embodiments.

In the above-described embodiments, methods of identifying a branched blood vessel from a flow-velocity vector of blood have been described as an example of a lumen inside which fluid flows. However, a lumen to which technology of the above-described lumen-analysis embodiments can be applied is not limited to a blood vessel.

As other examples, the above-described embodiments can be applied to a cerebral ventricular system inside which CSF (Cerebrospinal Fluid) flows and a lymph vessel inside which lymph fluid flows. In other words, the branching position where the second lumen branches from the first lumen can be determined in a similar manner by substituting the first lumen for the major blood vessel in the above-described embodiment and substituting the second lumen for a branched blood vessel branching from the major blood vessel.

In addition, three-dimensional image data for generating four-dimensional velocity vector information are not limited to three-dimensional image data obtained by an MRI apparatus. Technology of the above-described embodiments can applied by using three-dimensional image data obtained by other modalities such as an X-ray CT apparatus and a medical image diagnostic apparatus including a rotating-vessel imaging apparatus.

According to the medical image processing apparatus and the medical image processing method of at least one of the above-described embodiments, a bloodstream image by which a branched blood vessel can be observed can be generated.

The term "processor" in the above-described embodiments means, for instance, a circuit such as a special-purpose or general-purpose CPU (Central Processing Unit), a special-purpose or general-purpose GPU (Graphics Processing Unit), an ASIC (Application Specific Integrated Circuit), a programmable logic device including an SPLD (Simple Programmable Logic Device) and a CPLD (Complex Programmable Logic Device) as examples, and an FPGA (Field Programmable Gate Array).

A processor implements various types of functions by reading out programs stored in a memory circuit and executing the programs.

In addition, programs may be directly installed in the circuit of the processor instead of storing the programs in a separate memory circuit. In this case, the processor implements various types of functions by reading out programs installed in its circuit and executing these programs.

Although a case where unified processing circuitry implements respective functions has been described in the above-described embodiments, the processing circuitry may be configured by combining plural processors being independent of each other so that each of the processers implements each function by executing the corresponding program.

Furthermore, when plural processors are provided, memory media for storing programs may be provided for the respective processors or one memory medium may collectively store all the programs corresponding to the functions of each processor.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A medical image processing apparatus, comprising: processing circuitry; and
a display,
wherein the processing circuitry is configured to
   (a) calculate fluid information including flow-velocity vectors based on three-dimensional image data of plural time phases, which are acquired by a phase contrast method of magnetic resonance imaging, and in which fluid flowing inside a lumen is depicted,
   (b) identify a branching position where a second lumen branches from a first lumen, based on change in flow volume of fluid flowing inside the first lumen along an extending direction of the first lumen, wherein the processing circuitry is configured to identify the branching position based on an integral value obtained by calculating in-plane flow volume of fluid in each of plural short-axis cross-sections of the first lumen in parallel with each other along the extending direction and integrating the in-plane flow volume of every short-axis cross-section, and
   (c) cause the display to display an analysis result including fluid information of fluid flowing inside the second lumen, based on the branching position.

2. The medical image processing apparatus according to claim 1, wherein the processing circuitry is further configured to cause the display to display a color image in which two chromatic colors different from each other are respectively assigned to the first lumen and the second lumen.

3. The medical image processing apparatus according to claim 1, wherein the processing circuitry is further configured to cause the display to display the analysis result m which a marker indicative of the branching position is included.

4. The medical image processing apparatus according to claim 1, wherein the processing circuitry is configured to
   (a) perform flow-volume comparison processing on each of the plural short-axis cross-sections to identify a specific short-axis cross-section whose flow volume is smaller than a flow volume of another short-axis cross-section adjacent to the specific short-axis cross-section on an upstream side in a flow of the fluid in the first lumen, and
   (b) determine that the branching position exists in the specific short-axis cross-section identified.

5. The medical image processing apparatus according to claim 4, wherein the processing circuitry is further configured to
   (a) generate a first fluid image in which the first lumen is depicted, by performing threshold processing on flow-velocity vectors of respective voxels of the three-dimensional image data of plural time phases using a first threshold value, and
   (b) generate a second fluid image in which the second lumen is depicted, by performing threshold processing on flow-velocity vectors of respective voxels of the specific short-axis using a second threshold value smaller than the first threshold value.

6. A medical image processing apparatus, comprising: processing circuitry; and
a display,
wherein the processing circuitry is configured to
   (a) calculate fluid information including flow-velocity vectors based on three-dimensional image data of plural time phases, which are acquired by a phase contrast method of magnetic resonance imaging, and in which fluid flowing inside a lumen is depicted,
   (b) identify a branching position where a second lumen branches from a first lumen, based on change in flow volume of fluid flowing inside the first lumen along an extending direction of the first lumen, and
   (c) cause the display to display an analysis result including fluid information of fluid flowing inside the second lumen, based on the branching position,
wherein the processing circuitry is further configured to
   identify a second lumen region outside a first lumen region which extends in parallel with a direction of a flow of the fluid in the first lumen,
   divide each of velocity vectors into a component of the extending direction and a component of a vertical direction being perpendicular to the extending direction, and
   identify the branching position based on distribution of the component of a vertical direction inside the second lumen region.

7. The medical image processing apparatus according to claim 1, wherein the processing circuitry is further configured to calculate an accumulated velocity vector by integrating flow-velocity vectors of the plural time phases.

8. The medical image processing apparatus according to claim 1, further comprising trace-method memory circuitry configured to store plural trace methods of tracing a track of a flow of the fluid,
   wherein the processing circuitry is further configured to analyze the fluid information by determining whether each of the plural trace methods can be applied to the plural short-axis cross-sections or not, based on flow-velocity vectors of the plural short-axis cross-sections.

9. The medical image processing apparatus according to claim 8, wherein the plural trace methods include at least one of
   (a) a method of linearly tracing a track of a blood flow in such a manner that flow-velocity vectors of a target short-axis cross-section become perpendicular to a short-axis cross-section adjacent to the target short-axis cross-section on an upstream side in a blood flow of a major blood vessel as the first lumen, (b) a method of tracing a track of a blood flow in such a manner that flow volume of the target short-axis cross-section does not change from flow volume of the short-axis cross-section adjacent to the target short-axis cross-section on an upstream side, and (c) a method of tracing a track of a blood flow in such a manner that a direction of the flow-velocity vector of the target cross-section becomes equal to a direction of the flow-velocity vector of the adjacent cross-section on the upstream side.

10. The medical image processing apparatus according to claim 8, wherein the processing circuitry is further configured to analyze the fluid information by assigning a weight to each of the plural trace methods according to a degree of importance of each of the plural trace methods.

11. A medical image processing apparatus, comprising:

processing circuitry; and a display, wherein the processing circuitry is configured to (a) calculate fluid information including flow-velocity vectors based on three-dimensional image data of plural time phases in which fluid flowing inside a lumen is depicted, (b) identify a branching position where a second lumen branches from a first lumen, based on change in flow volume of fluid flowing inside the first lumen along an extending direction of the first lumen, and (c) cause the display to display an analysis result including fluid information of fluid flowing inside the second lumen, based on the branching position and wherein the processing circuitry is configured to identify the branching position based on an integral value obtained by calculating in-plane flow volume of fluid in each of plural short-axis cross-sections of the first lumen in parallel with each other along the extending direction and integrating the in-plane flow volume of every short-axis cross-section.

12. A medical image processing method, comprising:

calculating fluid information including flow-velocity vectors based on three-dimensional image data of plural time phases, which are acquired by a phase contrast method of magnetic resonance imaging, and in which fluid flowing inside a lumen is depicted;

identifying a branching position where a second lumen branches from a first lumen, based on change in flow volume of fluid flowing inside the first lumen along an extending direction of the first lumen; and displaying an analysis result including fluid information of fluid flowing inside the second lumen, based on the branching position, wherein the branching position is identified based on an integral value obtained by calculating in-plane flow volume of fluid in each of plural short-axis cross-sections of the first lumen in parallel with each other along the extending direction and integrating the in-plane flow volume of every short-axis cross-section.

\* \* \* \* \*